(12) United States Patent
Fukumizu et al.

(10) Patent No.: US 8,519,371 B2
(45) Date of Patent: Aug. 27, 2013

(54) NONVOLATILE MEMORY DEVICE AND METHOD FOR MANUFACTURING THE SAME

(75) Inventors: Hiroyuki Fukumizu, Kanagawa-ken (JP); Naoya Hayamizu, Kanagawa-ken (JP); Makiko Tange, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/876,870

(22) Filed: Sep. 7, 2010

(65) Prior Publication Data

US 2011/0037045 A1 Feb. 17, 2011

Related U.S. Application Data

(63) Continuation of application No. PCT/JP2008/065588, filed on Aug. 29, 2008.

(30) Foreign Application Priority Data

Mar. 7, 2008 (JP) ................................. 2008-057470

(51) Int. Cl.
*H01L 29/02* (2006.01)
(52) U.S. Cl.
USPC ................ 257/2; 257/536; 438/385; 365/140
(58) Field of Classification Search
USPC .................................................. 257/2, 3, 4, 5
See application file for complete search history.

(56) References Cited

FOREIGN PATENT DOCUMENTS

| JP | 2005-522045 | 7/2005 |
| JP | 2006-210882 | 8/2006 |
| JP | 2007-180474 | 7/2007 |
| JP | 2007-184419 | 7/2007 |
| JP | 2008-118108 | 5/2008 |
| KR | 10-2008-0018840 | 2/2008 |
| WO | WO 03/085675 A2 | 10/2003 |

OTHER PUBLICATIONS

Machine translation of Korean Document 10-2008-0018840.*
Machine translation of Japanese Document 2007-180474.*
Office Action issued Aug. 24, 2011 in Korean Patent Application No. 10-2010-7019807 (with English translation).
U.S. Appl. No. 12/886,257, filed Sep. 20, 2010, Fukumizu.
Chinese Office Action issued Feb. 13, 2012 in patent application No. 200880127778.1 with English translation.
Japanese Office Action Issued Dec. 10, 2012 in Patent Application No. 2008-057470 (with English translation).
Chinese Office Action issued on Dec. 3, 2012 in corresponding Chinese Application No. 200880127778.1 (with an English Translation).

* cited by examiner

*Primary Examiner* — Julio J Maldonado
*Assistant Examiner* — Sonya D McCall Shepard
(74) *Attorney, Agent, or Firm* — Oblon, Spivak, McClelland, Maier & Neustadt, L.L.P.

(57) ABSTRACT

According to one embodiment, a nonvolatile memory device includes a substrate, a first electrode, a second electrode, and a memory. The first electrode is provided on the substrate. The second electrode crosses on the first electrode. The memory portion is provided between the first electrode and the second electrode. At least one of an area of a first memory portion surface of the memory portion opposed to the first electrode and an area of a second memory portion surface of the memory portion opposed to the second electrode is smaller than an area of a cross surface of the first electrode and the second electrode opposed to each other by the crossing.

5 Claims, 21 Drawing Sheets

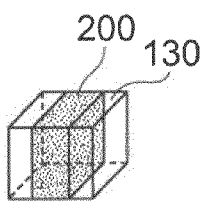
FIG. 6A
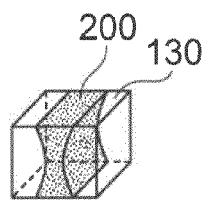
FIG. 6B
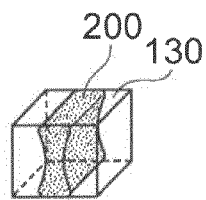
FIG. 6C
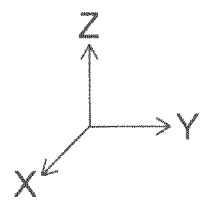
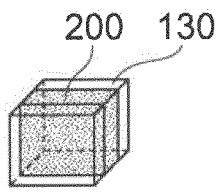
FIG. 6D
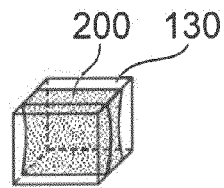
FIG. 6E
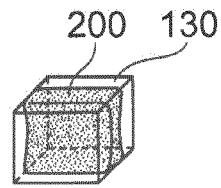
FIG. 6F
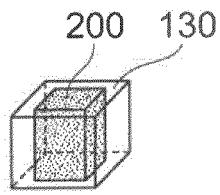
FIG. 6G
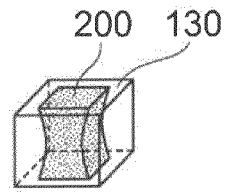
FIG. 6H
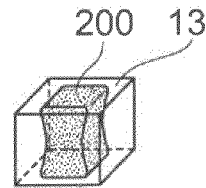
FIG. 6I
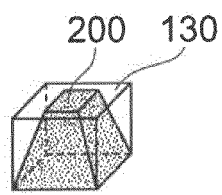
FIG. 6J
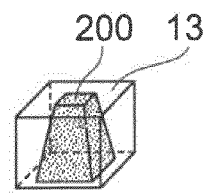
FIG. 6K
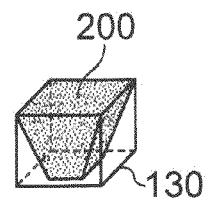
FIG. 6L
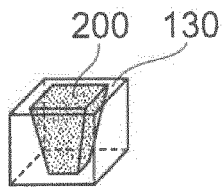
FIG. 6M

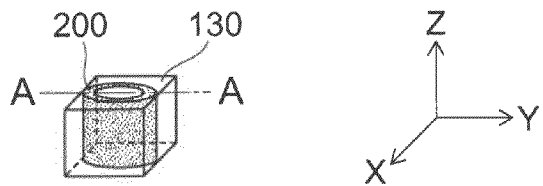
FIG. 7A
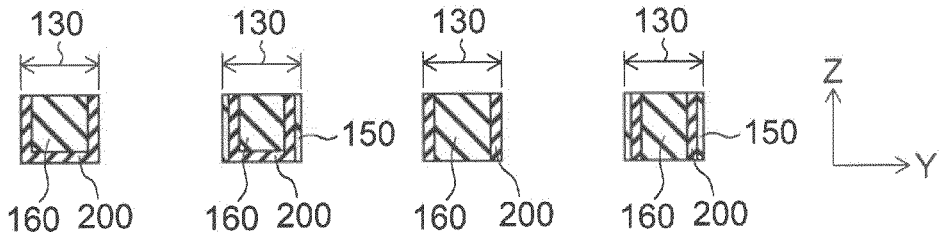
FIG. 7B  FIG. 7C  FIG. 7D  FIG. 7E
 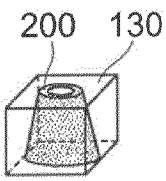 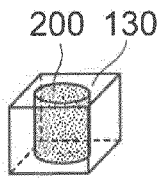 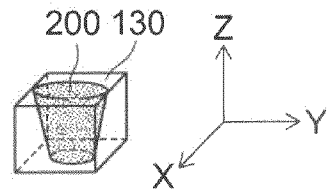
FIG. 7F  FIG. 7G  FIG. 7H  FIG. 7I
 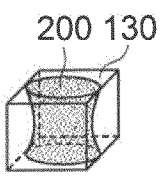 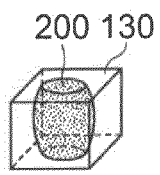 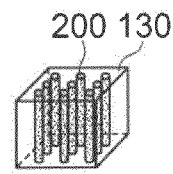
FIG. 7J  FIG. 7K  FIG. 7L  FIG. 7M
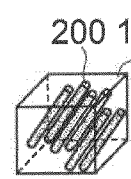 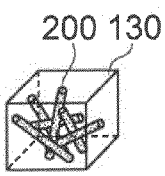
FIG. 7N  FIG. 7O

US 8,519,371 B2

NONVOLATILE MEMORY DEVICE AND METHOD FOR MANUFACTURING THE SAME

CROSS-REFERENCE TO RELATED APPLICATIONS

This is a continuation application of International Application PCT/JP2008/065588, filed on Aug. 29, 2008. This application also claims priority to Japanese Application No. 2008-057470, filed on Mar. 7, 2008. The entire contents of each are incorporated herein by reference.

FIELD

Embodiments described herein relate generally to a nonvolatile memory device and a method for manufacturing the same.

BACKGROUND

Flash memories widely used as nonvolatile memory devices are regarded as being limited in the improvement of integration density. As a nonvolatile memory device enabling the so-called $4F^2$ cell area, which realizes a higher integration density than flash memories, a cross-point nonvolatile memory device has been drawing attention. The cross-point nonvolatile memory device is configured so that, for instance, a memory portion having variable electrical resistance is sandwiched between two electrodes (JP-A 2007-184419 (Kokai)).

In the cross-point nonvolatile memory device, it is desired to reduce the current flowing in the memory portion and suppress the power consumption.

JP-A 2006-210882 (Kokai) proposes a technique for a nonvolatile memory device. In this technique, a contact hole is provided in an insulating layer on a lower electrode connected to a transistor. A memory portion is provided so as to fill the contact hole.

BRIEF DESCRIPTION OF THE DRAWINGS

FIGS. 6A to 6M are schematic views illustrating the configuration of the nonvolatile memory device according to the first embodiment of the invention.

FIGS. 7A to 7O are schematic views illustrating the configuration of the nonvolatile memory device according to the first embodiment of the invention.

DETAILED DESCRIPTION

In general, according to one embodiment, a nonvolatile memory device includes a substrate, a first electrode, a second electrode, and a memory. The first electrode is provided on the substrate. The second electrode crosses on the first electrode. The memory portion is provided between the first electrode and the second electrode. At least one of an area of a first memory portion surface of the memory portion opposed to the first electrode and an area of a second memory portion surface of the memory portion opposed to the second electrode is smaller than an area of a cross surface of the first electrode and the second electrode opposed to each other by the crossing.

In general, according to one embodiment, a method for manufacturing a nonvolatile memory device is disclosed. The method includes forming a first electrode on a substrate; forming an insulating film on the substrate and the first electrode; forming a recess in the insulating film on the first electrode; forming a memory portion on an inner wall of the recess; filling a remaining space of the recess surrounded by the memory portion with an insulating portion; and forming a second electrode on the memory portion and the insulating portion.

In general, according to one embodiment, a method for manufacturing a nonvolatile memory device is disclosed. The method includes: forming a stacked body on a substrate, the stacked body including a first electrode and a memory portion provided on the first electrode; etching back a sidewall of the memory portion exposed at a sidewall of the stacked body; and forming a second electrode on the memory portion In general, according to one embodiment, a method for manufacturing a nonvolatile memory device is disclosed. The method includes: forming a stacked body on a substrate, the stacked body including a first electrode and a memory portion provided on the first electrode; depositing a conductive material on the stacked body; selectively etching the conductive material and the memory portion to form a second electrode and a memory portion selectively provided under the second electrode; and etching back a sidewall of the memory portion selectively provided under the second electrode Embodiments of the invention will now be described in detail with reference to the drawings.

(First Embodiment)

Figure 1:
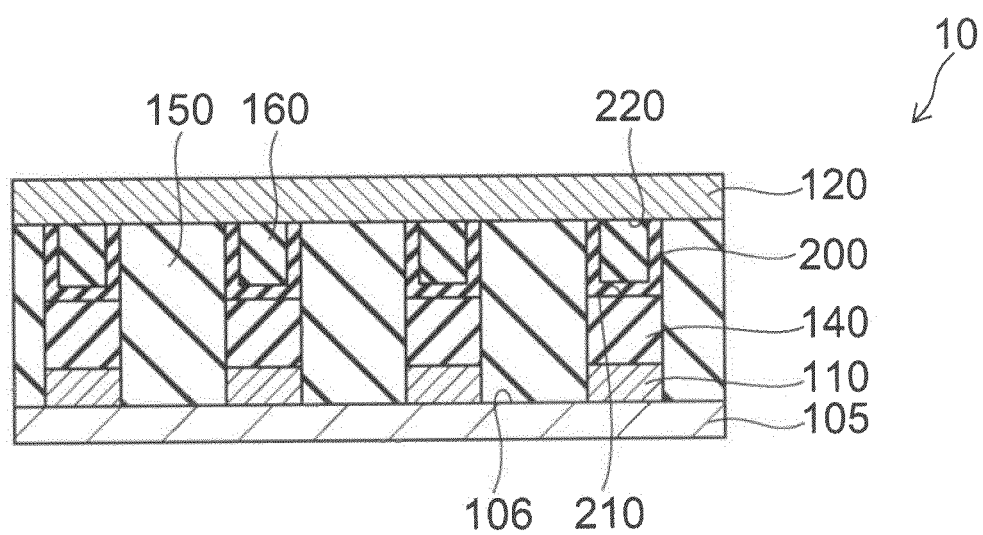
FIG. 1 is a schematic sectional view illustrating the configuration of a nonvolatile memory device according to a first embodiment of the invention.

FIG. 1 is a schematic sectional view illustrating the configuration of a nonvolatile memory device according to a first embodiment of the invention.

As shown in FIG. 1, the nonvolatile memory device 10 of the first embodiment of the invention includes a substrate 105, a first electrode 110 provided on the major surface 106 of the substrate 105, a second electrode 120 opposed to the first electrode 110, and a memory portion 200 provided between the first electrode 110 and the second electrode 120.

The substrate 105 can be e.g. a silicon substrate. The substrate 105 can be provided with a driver circuit for driving the nonvolatile memory device.

The first electrode 110 and the second electrode 120 can be made of e.g. tungsten, tungsten silicide, or tungsten nitride.

The memory portion 200 can be made of various transition metal oxides having electrical resistance changing with the applied voltage or current, such as nickel oxide ($NiO_x$), titanium oxide ($TiO_x$), $ZnMn_2O_4$, and $Pr_xCa_{1-x}MnO_3$. Alternatively, the memory portion 200 can be made of a phase transition material.

At least one of the area of the first memory portion surface 210 of the memory portion 200 opposed to the first electrode 110 and the area of the second memory portion surface 220 of the memory portion 200 opposed to the second electrode 120 is set smaller than the area of the cross surface 130 where the first electrode 110 and the second electrode 120 are opposed to each other.

Furthermore, as shown in FIG. 1, the memory portion 200 illustratively includes a plurality of regions spaced from each other. An insulating portion 160 can be sandwiched between the plurality of regions (inside the memory portion 200).

In the region other than the portion where the first electrode 110 and the second electrode 120 are opposed to each other, a device isolation insulating portion 150 is provided.

These insulating portion 160 and device isolation insulating portion 150 can be made of e.g. silicon oxide ($SiO_2$) having high electrical resistance. However, the insulating portion 160 and the device isolation insulating portion 150 are not limited thereto. The insulating portion 160 and the device isolation insulating portion 150 can be made of various materials having higher electrical resistance than the memory portion 200. For instance, in the case where the memory portion 200 is made of a material having electrical resistance changing with the applied voltage, the insulating portion 160 and the device isolation insulating portion 150 can be made of a material with the electrical resistance being higher than that of the memory portion 200 and not changing in the applied voltage range. Furthermore, also in the case where the memory portion 200 is made of a phase transition material, the insulating portion 160 and the device isolation insulating portion 150 can be made of a material having electrical resistance higher than the electrical resistances of the memory portion 200 in a plurality of phases.

The details are described below.

Figure 2A:
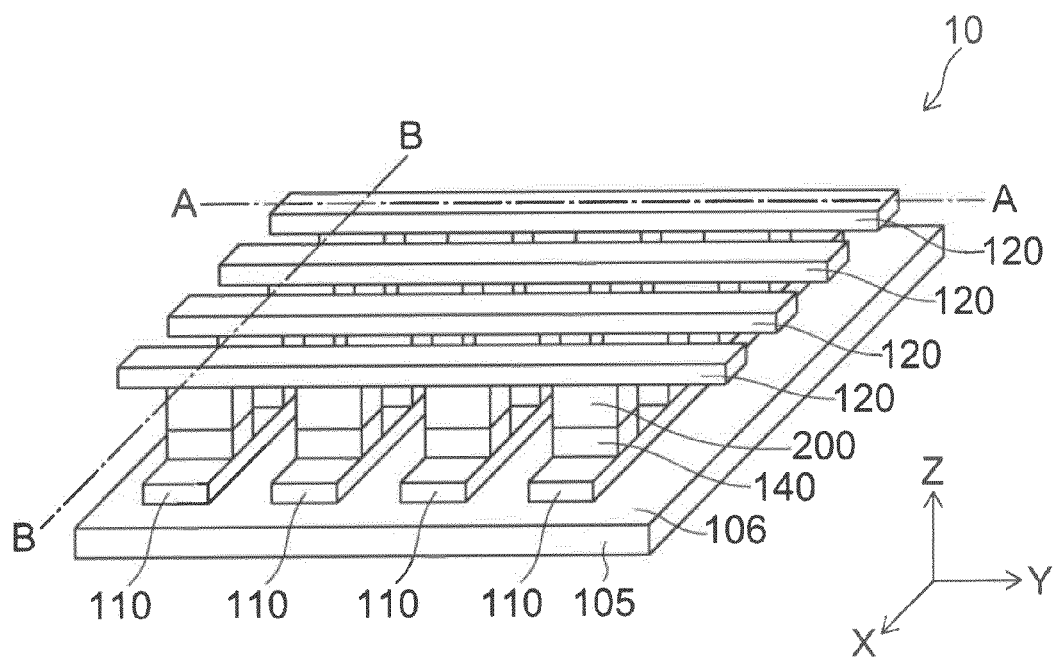
FIGS. 2A and 2B are schematic views illustrating the configuration of the nonvolatile memory device according to the first embodiment of the invention.
Figure 2B:
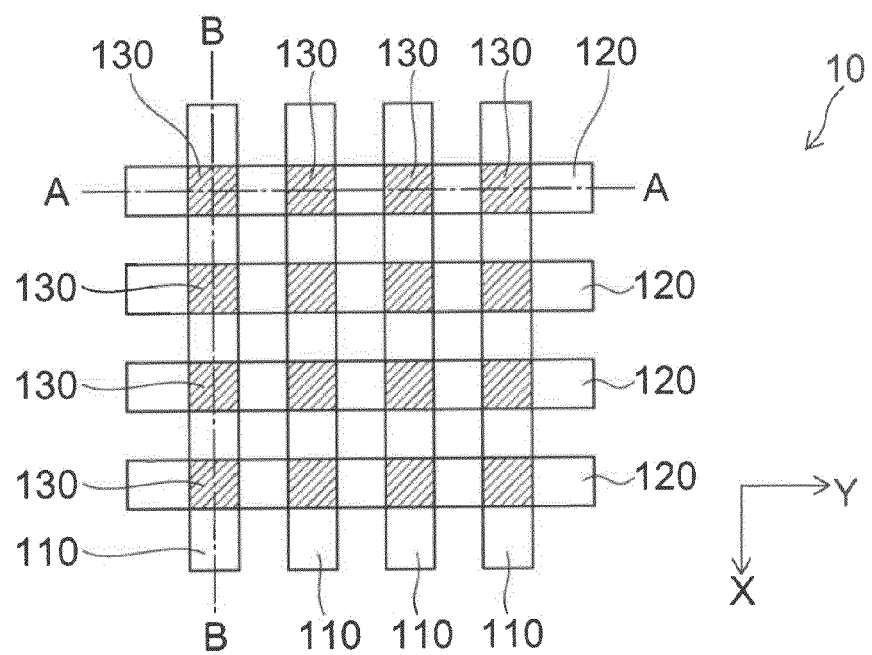

FIGS. 2A and 2B are schematic views illustrating the configuration of the nonvolatile memory device according to the first embodiment of the invention.

In FIG. 2A and the subsequent figures, components similar to those described previously with reference to earlier figures are labeled with like reference numerals, and the detailed description thereof is omitted as appropriate.

FIG. 2A is a schematic perspective view illustrating the configuration of the nonvolatile memory device according to the first embodiment. In FIGS. 2A and 2B, the device isolation insulating portion 150 is omitted.

As shown in FIG. 2A, in the nonvolatile memory device 10 of the first embodiment of the invention, a strip-shaped first electrode 110 extending in the X-axis direction is provided on the major surface 106 of the substrate 105. Furthermore, a strip-shaped second electrode 120 extending in the Y-axis direction orthogonal to the X-axis in the plane parallel to the substrate 105 is provided to be opposed to the first electrode 110.

FIGS. 2A and 2B show an example in which four first electrodes 110 and four second electrodes 120 are provided. However, the number of first electrodes 110 and second electrodes 120 is not limited thereto, but is arbitrary. By way of example, the first electrode 110 is referred to as bit line (BL), and the second electrode 120 is referred to as word line (WL). However, alternatively, the first electrode 110 may be referred to as word line (WL), and the second electrode 120 may be referred to as bit line (BL).

A memory portion 200 is sandwiched between the first electrode 110 and the second electrode 120. That is, in the nonvolatile memory device 10, the bit line and the word line cross three-dimensionally, and a memory portion 200 is provided at the portion formed therebetween (cross point). Depending on the combination of the potential applied to the first electrode 110 and the potential applied to the second electrode, the voltage applied to each memory portion 200 is varied. Due to the characteristics of the memory portion 200 in response thereto, information can be stored. Here, to impart directionality to the polarity of the voltage applied to the memory portion 200, for instance, a switching element portion 140 having rectifying characteristics can be provided. The switching element portion 140 can include e.g. a PIN diode or a MIM (metal-insulator-metal) element. FIGS. 1 and 2A show an example in which the switching element portion 140 is provided between the first electrode 110 and the memory portion 200. However, the switching element portion 140 may be provided between the second electrode 120 and the memory portion 200. Alternatively, the switching element portion 140 may be provided in a region other than the region where the first electrode 110 and the second electrode 120 are opposed to each other.

Furthermore, a barrier metal layer, not shown, can be provided between the first electrode 110 and the switching element portion 140, between the switching element portion 140 and the memory portion 200, and between the memory portion 200 and the second electrode 120. The barrier metal layer can be made of e.g. titanium (Ti) or titanium nitride (TiN).

Here, one memory portion 200 (and switching element portion 140), which is provided in the region formed between one first electrode 110 and one second electrode 120 crossing three-dimensionally, constitutes one component referred to as cell.

FIG. 2B is a schematic plan view illustrating the configuration of the nonvolatile memory device according to the first embodiment. That is, FIG. 2B is a schematic plan view as viewed in the Z-axis direction orthogonal to the X-axis and Y-axis. As shown in FIG. 2B, in the nonvolatile memory device 10, each electrode region formed by the first electrode 110 (e.g., bit line, hereinafter omitted) and the second electrode 120 (e.g., word line, hereinafter omitted) opposed to each other is referred to as cross surface 130. Here, the first electrode 110 and the second electrode 120 cross three-dimensionally, thereby each including a cross surface 130 opposed to the other. In the plan view of FIG. 2B, the cross surface 130 indicates that the cross surfaces 130 of the first electrode 110 and the second electrode 120 generally overlap each other as viewed in the Z-axis direction.

Figure 3A:
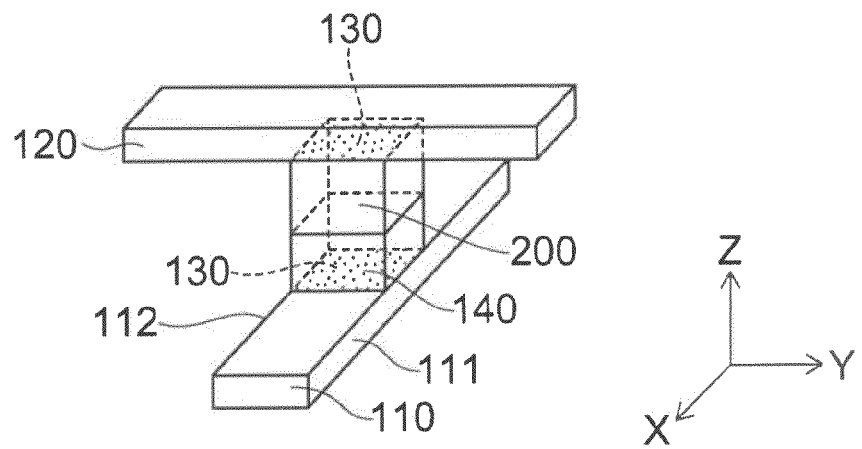
FIGS. 3A to 3C are schematic views illustrating the configuration of the nonvolatile memory device according to the first embodiment of the invention.
Figure 3B:
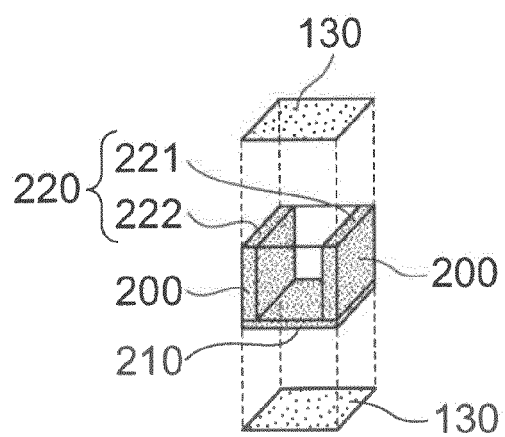
Figure 3C:
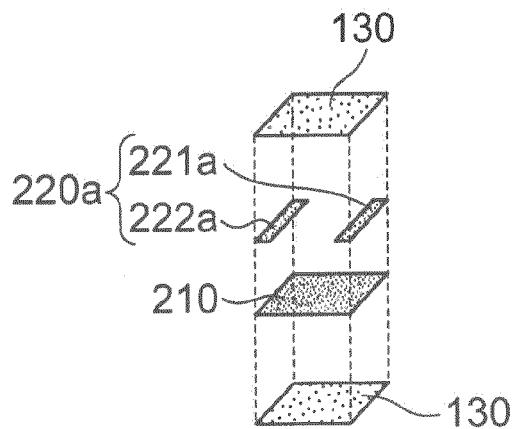

FIGS. 3A to 3C are schematic views illustrating the configuration of the nonvolatile memory device according to the first embodiment of the invention.

FIG. 3A is a schematic perspective view illustrating the configuration of the nonvolatile memory device 10 according to the first embodiment. FIG. 3A partly illustrates one cell of the nonvolatile memory device 10 illustrated in FIGS. 1, 2A, and 2B. In FIGS. 3A to 3C, the device isolation insulating portion 150 and the insulating portion 160 are omitted.

FIG. 3B illustrates the configuration of the memory portion 200 in one cell. As shown in FIG. 3B, in the nonvolatile memory device 10 of the first embodiment of the invention, the memory portion 200 has the same shape (same area) as the cross surface 130 in the first memory portion surface 210 opposed to the first electrode 110. On the other hand, in the second memory portion surface 220 opposed to the second electrode 120, the memory portion 200 includes a first sidewall portion 221 and a second sidewall portion 222. The first sidewall portion 221 and the second sidewall portion 222, respectively, correspond to the positions of the edges (i.e., the positions close to the first edge 111 and the second edge 112, respectively) in the line width direction (the aforementioned Y-axis direction) of the first electrode 110 in the cross surface 130 shown in FIG. 3A.

In this example, the first sidewall portion 221 and the second sidewall portion 222 are provided along the X-axis direction (i.e., the extending direction of the first electrode 110). However, as described later, the first sidewall portion 221 and the second sidewall portion 222 may be provided along the Y-axis direction. Furthermore, the first sidewall portion 221 and the second sidewall portion 222 can be opposed to each other.

Thus, the first sidewall portion 221 and the second sidewall portion 222 are opposed in the direction parallel to the cross surface 130. Specifically, in the memory portion 200, the first sidewall portion 221 and the second sidewall portion 222 extend along the direction crossing the cross surface 130.

FIG. 3C illustrates the relationship between the cross surface 130 and the memory portion 200 in one cell. More specifically, FIG. 3C selectively depicts the first memory portion surface 210 of the memory portion 200 opposed to the first electrode 110, and the second memory portion surface 220 of the memory portion 200 opposed to the second electrode 120. As shown in FIG. 3C, in the nonvolatile memory device 10 according to the first embodiment, in the second memory portion surface 220 opposed to the second electrode 120, the memory portion 200 includes the upper surface 221a of the first sidewall portion 221 and the upper surface 222a of the second sidewall portion 222. The total area of these upper surface 221a of the first sidewall portion 221 and upper surface 222a of the second sidewall portion 222 is smaller than the area of each cross surface 130. Furthermore, the space between the first sidewall portion 221 and the second sidewall portion 222 is filled with the insulating portion 160 as shown in FIG. 1.

That is, the area of the second memory portion surface 220 of the memory portion 200 facing the second electrode 120 is smaller than the area of each cross surface 130 formed by the first electrode 110 and the second electrode 120 opposed to each other. That is, the cross-sectional area of the memory portion 200 in the plane parallel to the major surface 106 of the substrate 105 is smaller than the area of each cross surface 130 formed by the first electrode 110 and the second electrode 120 opposed to each other.

Thus, the nonvolatile memory device 10 of the first embodiment can reduce the current flowing in the memory portion 200 and achieve lower power consumption.

According to the inventors' investigation, it has been found that in the cross-point nonvolatile memory element, the value of current flowing in the memory portion 200 is strongly correlated with the cross-sectional area of the memory portion 200 in the direction of current flow. For instance, in the case where the memory portion 200 is made of a resistance change material having resistance changing with the applied voltage, the current (reset current) in the off-state (high resistance state) of the memory portion 200 greatly depends on the cross-sectional area of the memory portion 200. Hence, if the cross-sectional area of the memory portion 200 decreases, the read current for reading the off-state decreases, and the power consumption of the nonvolatile memory device can be reduced.

Furthermore, the current in the on-state (low resistance state) also greatly depends on the cross-sectional area of the memory portion 200. More specifically, the number of filaments, supposedly serving as the current path in the on-state, depends on the area of the memory portion 200. It is considered that if the cross-sectional area of the memory portion 200 is smaller, the number of filaments decreases and results in a higher resistance in the on-state. Hence, if the cross-sectional area of the memory portion 200 decreases, the current in the on-state also decreases, and the power consumption of the nonvolatile memory device can be reduced.

Furthermore, the first memory portion surface 210 of the memory portion 200 opposed to the first electrode 110, and the second memory portion surface 220 of the memory portion 200 facing the second electrode 120 serve as the path of current flowing into the memory portion 200. If the area of the first memory portion surface 210 and the area of the second memory portion surface 220 are decreased, the current flowing in the memory portion 200 can be decreased, and the power consumption of the nonvolatile memory device can be reduced.

In the nonvolatile memory device 10 of the first embodiment of the invention, the area of the second memory portion surface 220 of the memory portion 200 facing the second electrode 120 is set smaller than the area of the cross surface 130 formed by the first electrode 110 and the second electrode 120 opposed to each other. Thus, the cross-sectional area of the memory portion 200 serving as the current path of the memory portion 200 is decreased in the second memory portion surface 220. Thus, the nonvolatile memory device 10 can reduce the current flowing in the memory portion 200 and achieve lower power consumption.

COMPARATIVE EXAMPLE

In the following, a nonvolatile memory device of a comparative example is described.

Figure 4A:
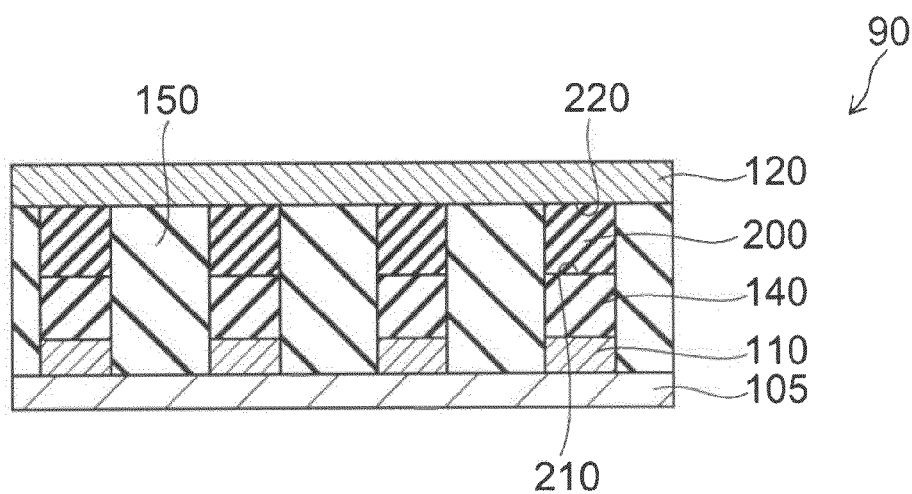
FIGS. 4A to 4C are schematic views illustrating the configuration of a nonvolatile memory device of a comparative example.
Figure 4B:
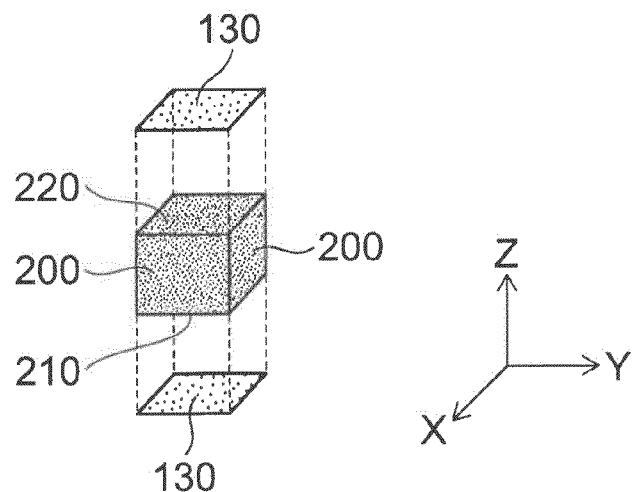
Figure 4C:
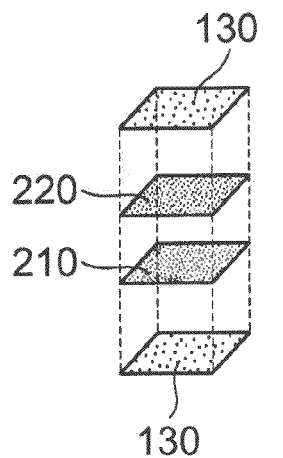

FIGS. 4A to 4C are schematic views illustrating the configuration of the nonvolatile memory device of the comparative example.

FIG. 4A is a schematic sectional view illustrating the configuration of the nonvolatile memory device of the comparative example. As shown in FIG. 4A, the nonvolatile memory device 90 of the comparative example includes a substrate 105, a first electrode 110 provided on the substrate 105, a second electrode 120 opposed to the first electrode 110, and a memory portion 200 sandwiched between the first electrode 110 and the second electrode 120.

The area of the first memory portion surface 210 of the memory portion 200 opposed to the first electrode 110 and the area of the second memory portion surface 220 of the memory portion 200 opposed to the second electrode 120 are substantially equal to the area of the cross surface 130 formed by the first electrode 110 and the second electrode 120 opposed to each other. That is, the insulating portion 160 in FIG. 1 is not provided.

FIG. 4B illustrates the configuration of the memory portion 200 in one cell of the nonvolatile memory device 90 of the comparative example. As shown in FIG. 4B, in the nonvolatile memory device 90 of the comparative example, the memory portion 200 is shaped like a rectangular solid having an upper surface and a lower surface given by the cross surfaces 130 formed by the first electrode 110 and the second electrode 120 opposed to each other.

FIG. 4C illustrates the relationship between the cross surface 130 and the memory portion 200 in one cell. More specifically, FIG. 4C selectively depicts the first memory portion surface 210 of the memory portion 200 opposed to the first electrode 110, and the second memory portion surface 220 of the memory portion 200 opposed to the second electrode 120. As shown in FIG. 4C, in the nonvolatile memory device 90 of the comparative example, the area of the first memory portion surface 210 and the area of the second memory portion surface 220 are both substantially equal to the area of the cross surface 130 formed by the first electrode 110 and the second electrode 120 opposed to each other.

That is, in the nonvolatile memory device 90 of the comparative example, the cross-sectional shape of the memory portion 200 is substantially the same as the cross surface 130 formed by the first electrode 110 and the second electrode 120 opposed to each other. Thus, the cross-sectional area of the memory portion 200 serving as the current path is substantially equal to the cross surface 130, and results in a large current value. Accordingly, the power consumption is also made higher.

In contrast, in the nonvolatile memory device 10 of this embodiment illustrated in FIGS. 1 to 3C, the cross-sectional area of the memory portion 200 is smaller than the area of the cross surface 130. Furthermore, at least one of the area of the first memory portion surface 210 and the area of the second memory portion surface 220 of the memory portion 200 is smaller than the area of the cross surface 130. Thus, the current value is smaller than in the comparative example. Consequently, the power consumption can be made lower.

FIGS. 5A to 5D are schematic views illustrating the configuration of variations of the nonvolatile memory device according to the first embodiment of the invention.

FIGS. 5A to 5D are schematic perspective views illustrating various variations of the memory portion 200 of one cell portion in the nonvolatile memory device 10 according to the first embodiment, and the remaining portion is omitted.

Figure 5A:
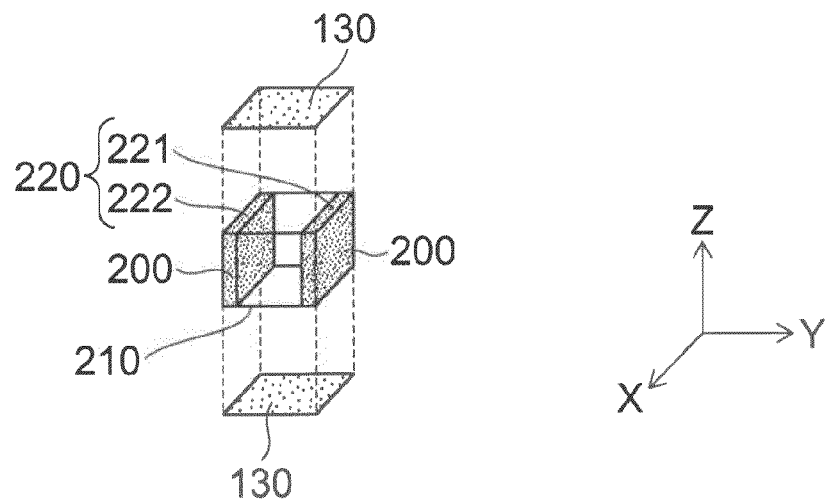
FIGS. 5A to 5D are schematic views illustrating the configuration of variations of the nonvolatile memory device according to the first embodiment of the invention.

As shown in FIG. 5A, in the nonvolatile memory device 10 according to the first embodiment, the memory portion 200 includes a first sidewall portion 221 and a second sidewall portion 222 throughout the vertical direction (layer thickness direction). The first sidewall portion 221 and the second sidewall portion 222, respectively, correspond to the first edge 111 and the second edge 112 of the first electrode 110 in the cross surface 130. That is, the area of the first memory portion surface 210 and the area of the second memory portion surface 220 are both smaller than the area of the cross surface 130. Furthermore, the space between the first sidewall portion 221 and the second sidewall portion 222 is filled with an insulating portion 160, not shown.

Thus, the nonvolatile memory device 10 of the first embodiment can reduce the current flowing in the memory portion 200 and achieve lower power consumption.

Figure 5B:
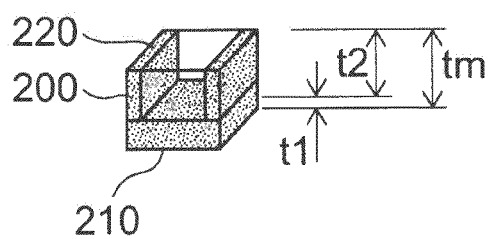

The shape of the memory portion 200 may be variously modified from the shape illustrated in FIG. 3B. More specifically, as shown in FIG. 5B, the ratio of the layer thickness $t_1$ of the portion on the first memory portion surface 210 side having substantially the same area as the cross surface 130 to the layer thickness $t_2$ of the first sidewall portion 221 and the second sidewall portion 222 on the second memory portion surface 220 side may be variously changed. (However, $t_2=0$ is excluded. That is, the condition that the cross section of the memory portion 200 is substantially the same as the cross surface 130 throughout the layer thickness $t_m$ of the memory portion 200 is excluded.) Here, the configuration illustrated in FIG. 5A corresponds to the configuration illustrated in FIG. 5B with $t_1=0$.

Figure 5C:
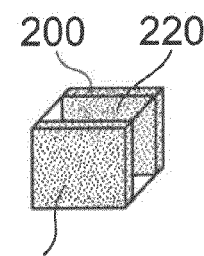
Figure 5D:
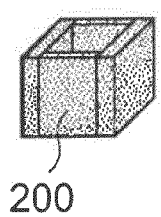

Alternatively, as shown in FIG. 5C, the memory portion 200 may be configured so that the arranging direction of the first sidewall portion 221 and the second sidewall portion 222 of the memory portion 200 illustrated in FIG. 5A is rotated 90 degrees about the Z-axis. In this case, the first sidewall portion 221 and the second sidewall portion 222 of the memory portion 200 illustrated in FIG. 5A are provided along the line width direction (the aforementioned Y-axis direction) of the first electrode 110. Furthermore, as shown in FIG. 5D, the memory portion 200 may be configured so that the memory portion 200 is provided in the four sidewall portions of a rectangular solid having an upper surface and a lower surface given by the cross surfaces 130. An insulating portion 160, not shown, is provided inside the memory portion 200. (Here, the memory portion 200 has a kind of annular shape.) Thus, the memory portion 200 can be provided in the sidewall portion of a columnar body having an upper surface and a lower surface given by the cross surfaces 130, and an insulating portion 160 can be provided (partly) inside the memory portion 200. Accordingly, the cross-sectional area of the memory portion 200 can be made smaller than the area of each cross surface 130. Thus, the nonvolatile memory device 10 of the first embodiment can reduce the current flowing in the memory portion 200 and achieve lower power consumption.

Furthermore, the memory portion 200 can be provided in the internal region of a columnar body having an upper surface and a lower surface given by the cross surfaces 130, and an insulating portion 160 (or a device isolation insulating film 159) can be provided (partly) around the columnar body. Accordingly, the area of at least one of the first memory portion surface 210 and the second memory portion surface 220 can also be made smaller than the area of each cross surface 130.

FIGS. 6A to 6M are schematic views illustrating the configuration of the nonvolatile memory device according to the first embodiment of the invention.

FIGS. 6A to 6M are schematic perspective views illustrating various configurations of the memory portion 200 of one cell portion in the nonvolatile memory device 10 according to the first embodiment. In FIGS. 6A to 6M, the insulating portion 160, the device isolation insulating portion 150 and the like are omitted.

As illustrated in FIGS. 6A to 6M, at least one of the first memory surface (e.g., the upper surface in FIGS. 6A to 6M) and the second memory surface (e.g., the lower surface in FIGS. 6A to 6M) of the memory portion 200 can be configured to have an edge which is recessed inside the cross surface 130 relative to the edge of the cross surface 130 as viewed in the direction perpendicular to each cross surface 130.

As shown in FIG. 6A, in the nonvolatile memory device 10 according to the first embodiment, the memory portion 200 may be located generally at the Y-direction center of a rectangular solid (columnar body) having an upper surface and a lower surface given by the cross surfaces 130, and may be shaped like a layer along the X direction. That is, in this case, the upper surface and the lower surface of the memory portion 200 have an edge which is recessed inside the cross surface 130 relative to the edge of the cross surface 130 along the Y direction.

On the other hand, as shown in FIG. 6B, the memory portion 200 may be shaped so that the Z-direction central portion of the memory portion 200 illustrated in FIG. 6A is thinned. Alternatively, as shown in FIG. 6C, the memory portion 200 may be shaped so that the memory portion 200 is thinned in the Z-direction central portion, and further thinned near the first memory portion surface 210 and the second memory portion surface 220.

Furthermore, as shown in FIGS. 6D to 6F, the shape and arrangement of the memory portion 200 illustrated in FIGS. 6A to 6C may be rotated 90 degrees about the Z-axis.

In this case, the memory portion 200 shaped as illustrated in FIGS. 6A to 6C is provided along the line width direction (the aforementioned Y-axis direction) of the first electrode 110.

Furthermore, as shown in FIG. 6G, the memory portion 200 may be shaped so that the memory portion 200 is located in a central portion in both the X direction and the Y direction. That is, in this case, the upper surface and the lower surface of the memory portion 200 have an edge which is recessed inside the cross surface 130 relative to the edge of the cross surface 130 over the entire circumference thereof. Furthermore, as shown in FIG. 6H, the memory portion 200 may be shaped so that the Z-direction central portion of the memory portion 200 illustrated in FIG. 6G is thinned. Alternatively, as shown in FIG. 6I, the memory portion 200 may be shaped so that the memory portion 200 is thinned in the Z-direction central portion, and further thinned near the first memory portion surface 210 and the second memory portion surface 220.

Furthermore, as shown in FIGS. 6J to 6M, the shape and arrangement of the memory portion 200 may be tapered in the Z direction. Here, the memory portion 200 is illustratively shaped so that one of the first memory portion surface 210 and the second memory portion surface 220 has a smaller area than the other, and that the cross section parallel to the Z-axis direction is gradually thinned from one of these surfaces to the other. That is, the area of the cross section of the memory portion 200 cut along the plane perpendicular to the film thickness direction of the memory portion 200 is varied in the film thickness direction. That is, the cross-sectional area of the memory portion 200 cut with a plane parallel to the cross surface 130 is varied in the direction crossing the cross surface 130. Furthermore, the area of the cross section of the memory portion 200 cut along the plane perpendicular to the film thickness direction of the memory portion 200 is small in the central portion between the first electrode 110 and the second electrode 120.

In FIG. 6J, in the memory portion 200, with respect to the cross surface 130, the area of the first memory portion surface 210 is comparable to the area of the cross surface 130 of the first electrode 110. This cross-sectional area is gradually reduced along the Z-axis direction. Thus, the area of the second memory portion surface 220 is smaller than the area of the first memory portion surface 210 (that is, the second memory portion surface 220 has a smaller area than the cross surface 130 of the second electrode 120).

In FIG. 6K, in the memory portion 200, the first memory portion surface 210 has a smaller area than the cross surface 130 of the first electrode 110. This area is gradually reduced in the Z-axis direction. Thus, the area of the second memory portion surface 220 is smaller than the area of the first memory portion surface 210. Furthermore, in FIG. 6K, as compared with FIG. 6J, the memory portion 200 is recessed further inside the cross surface 130, and has a smaller size (volume).

In FIGS. 6L and 6M, as compared with FIGS. 6J and 6K, respectively, although the shape of the memory portion 200 may be generally the same, the positional relationship in the Z-axis direction is reversed. That is, with respect to each cross surface 130 of the first electrode 110 and the second electrode 120, the positional relationship of the first memory portion surface 210 and the second memory portion surface 220 is reversed.

FIGS. 7A to 7O are schematic views illustrating the configuration of the nonvolatile memory device according to the first embodiment of the invention.

FIGS. 7A to 7O illustrate various shapes of the memory portion 200 of one cell portion in the nonvolatile memory device 10 according to the first embodiment. In some figures of FIGS. 7A to 7O, the insulating portion 160, the device isolation insulating portion 150 and the like are omitted.

FIG. 7A is a schematic perspective view of an example of the memory portion 200. As shown in FIG. 7A, in the nonvolatile memory device 10 according to the first embodiment, the shape and arrangement of the memory portion 200 may be configured as an annular column having an axis substantially parallel to the Z-axis and provided inside the (rectangular solid) columnar body having an upper surface and a lower surface given by the cross surfaces 130. FIGS. 7B and 7C are A-A sectional views of the memory portion 200 illustrated in FIG. 7A. As illustrated in FIG. 7B, the memory portion 200 may be configured so that the outer wall portion of the annular column substantially coincides with the edge of the cross surface 130, and that an insulating portion 160 is provided inside the annular column. Alternatively, as shown in FIG. 7C, the memory portion 200 may be configured so that the outer wall of the annular column is smaller than (located inside) the cross surface 130, and that an insulating portion 160 is provided inside the annular column. In these cases, an insulating portion 160 or a device isolation insulating portion 150 can be provided in the region between the outer wall of the annular column and the side surface of the rectangular solid having an upper surface and a lower surface given by the cross surfaces 130. Furthermore, as shown in FIGS. 7D and 7E, the memory portion 200 may be configured so that the memory portion 200 shaped like an annular column illustrated in FIGS. 7B and 7C is made annular throughout the layer thickness (Z-axis).

Furthermore, as shown in FIGS. 7F and 7G, the memory portion 200 may be shaped like an annular column tapered in the Z-axis direction.

Here, the memory portion 200 is shaped so that with respect to the cross surface 130, the first memory portion surface 210 and the second memory portion surface 220 are annular, one of these surfaces having a smaller area than the other, and the cross section parallel to the Z-axis direction being gradually reduced from one of these surfaces to the other.

In FIG. 7F, the memory portion 200 is annular and tapered along the Z-axis direction so that the annular column is gradually reduced from the second memory portion surface 220 to the first memory portion surface 210. Here, the area of the first memory portion surface 210 is smaller than the area of the second memory portion surface 220.

In FIG. 7G, the memory portion 200 is annular and tapered along the Z-axis direction so that the annular column is gradually reduced from the first memory portion surface 210 to the second memory portion surface 220. Here, the area of the second memory portion surface 220 is smaller than the area of the first memory portion surface 210.

In FIGS. 7F and 7G, although the shape of the memory portion 200 may be generally the same, the positional relationship in the Z-axis direction is reversed. That is, with respect to each cross surface 130 of the first electrode 110 and the second electrode 120, the positional relationship of the first memory portion surface 210 and the second memory portion surface 220 is reversed. In these cases, the cross-sectional area of the memory portion 200 cut with a plane parallel to the cross surface 130 is varied in the direction crossing the cross surface 130.

Furthermore, as shown in FIG. 7H, in the nonvolatile memory device 10 according to the first embodiment, the shape and arrangement of the memory portion 200 may be configured as a cylindrical column (elliptical column, polygonal column) having an axis substantially parallel to the Z-axis and provided inside a (rectangular solid) columnar body having an upper surface and a lower surface given by the cross surfaces 130. Furthermore, as shown in FIGS. 7I and 7J, the shape of the generally cylindrical column (polygonal column) illustrated in FIG. 7H may be modified into a shape tapered in the Z-axis direction. Furthermore, as shown in FIGS. 7K and 7L, the cylindrical column (elliptical column, polygonal column) illustrated in FIG. 7H may be shaped so that the diameter is increased or decreased in the central portion in the Z-axis direction. These may be further tapered in the Z-axis direction (not shown). In these cases, the cross-sectional area of the memory portion 200 cut with a plane parallel to the cross surface 130 is varied in the direction crossing the cross surface 130.

The structures of the memory portion 200 illustrated in FIGS. 7H to 7L can also be obtained by, e.g., the method of providing an independent hole (through hole) in the device isolation insulating portion 150 and filling the hole entirely with the material constituting the memory portion 200. In this case, the through hole is formed while performing two-dimensional alignment in the X-axis and Y-axis direction. Then, the through hole is filled with the material constituting the memory portion 200. Alternatively, as described later, the structures illustrated in FIGS. 7H to 7L can also be obtained by the method of etching back the sidewall of the memory portion 200. In this method, the two-dimensional alignment as described above is not particularly needed. Hence, the structures illustrated in FIGS. 7H to 7L can be obtained with higher accuracy and higher integration density.

Alternatively, as shown in FIG. 7M, in the nonvolatile memory device 10 according to the first embodiment, the shape and arrangement of the memory portion 200 may be configured as numerous columns opening in the Z-axis direction and provided inside a (rectangular solid) columnar body having an upper surface and a lower surface given by the cross surfaces 130.

For instance, it is possible to use a structure in which numerous columnar spaces filled with a material other than the material constituting the memory portion 200, or left as voids, are surrounded by the material constituting the memory portion 200. Such a structure can be formed by, e.g., forming carbon nanotubes in the direction perpendicular to the cross surface 130, filling the remaining region with the material constituting the memory portion 200, and then removing the carbon nanotubes by e.g. oxygen plasma. Here, subsequently, an insulating portion 160 or a device isolation insulating portion 150 can be provided in the region formed by the removal of the carbon nanotubes. However, this may be omitted and the region may be left in the hollow state.

FIG. 7M illustrates the case where the axis of the numerous columnar shapes is generally parallel to the Z-axis direction. However, for instance, as illustrated in FIG. 7N, the axis of the columnar shape may be inclined with respect to the Z-axis. Furthermore, as illustrated in FIG. 7O, the axis of each of the numerous columns may be inclined in a different direction.

Furthermore, the memory portion 200 can include a plurality of columnar structures opening in at least one of the first electrode 110 and the second electrode 120. That is, the columnar shape itself illustrated in FIGS. 7M to 7O can illustratively be made of the material constituting the memory portion 200. Also in this case, the axis of the columnar structures can be perpendicular or inclined with respect to the cross surface 130. For instance, the axial direction of the plurality of columnar structures constituting the memory portion 200 can be inclined with respect to the Z-axis direction. Then, the path of current flowing between the first electrode 110 and the second electrode 120 can be formed in an inclined direction rather than a simple straight direction. Thus, the current path can be made longer, and a stable resistance change state can be achieved. Simultaneously, the effective area of the memory portion 200 can be reduced.

In this case, these columnar structures do not necessarily need to be each in contact with the first electrode 110 and the second electrode 120. Instead, the columnar structures may be provided so that some of the columnar structures are coupled to form a current flow path between the first electrode 110 and the second electrode 120. Here, each columnar structure may have a different length and thickness.

In such a structure, the memory portion 200 can be made of a material containing carbon nanotubes. To fabricate such a columnar structure, it is possible to use a structure in which an insulating material mixed with carbon nanotubes is sandwiched between the first electrode 110 and the second electrode 120. Then, by appropriate heat treatment, the structure of the carbon nanotube is varied to have higher resistivity. The method for forming carbon nanotubes may be based on the use of arc plasma or microwave plasma. Alternatively, carbon nanotubes may be formed by sintering and drying a solution of carbon nanotubes in a solvent such as methanol and ethanol. The carbon nanotube has a thin columnar shape. Carbon nanotubes are mixed in the insulating material with the axis of the columnar shape randomly oriented.

That is, the memory portion 200 having the structure as illustrated in FIG. 7O is obtained. In this structure, the axis of each of the numerous columns is inclined in a different direction. Thus, in the memory portion 200, a stable resistance change can be achieved. Also in this case, the area of the memory portion 200 is smaller than the area of the cross surface 130. Thus, the current flowing in the memory portion 200 can be reduced, and the power consumption can be suppressed.

In any of these cases, at least one of the area of the first memory portion surface 210 of the memory portion 200 opposed to the first electrode 110 and the area of the second memory portion surface 220 of the memory portion 200 opposed to the second electrode 120 is smaller than the area of the cross surface 130 formed by the first electrode 110 and the second electrode 120 opposed to each other. That is, the cross-sectional area of the memory portion 200 is smaller than the area of the cross surface 130. Thus, the nonvolatile memory device 10 of the first embodiment can reduce the current flowing in the memory portion 200 and suppress power consumption.

Furthermore, the nonvolatile memory device 10 according to this embodiment can be configured so that a plurality of memory portions 200 are stacked in the Z-axis direction.

Figure 8A:
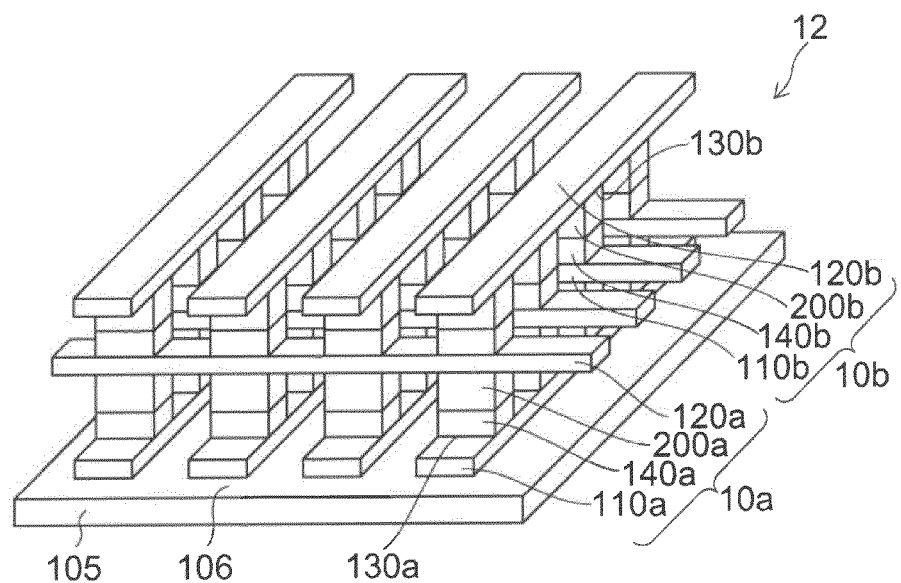
FIGS. 8A and 8B are schematic perspective views illustrating the configuration of nonvolatile memory devices according to the first embodiment of the invention.
Figure 8B:
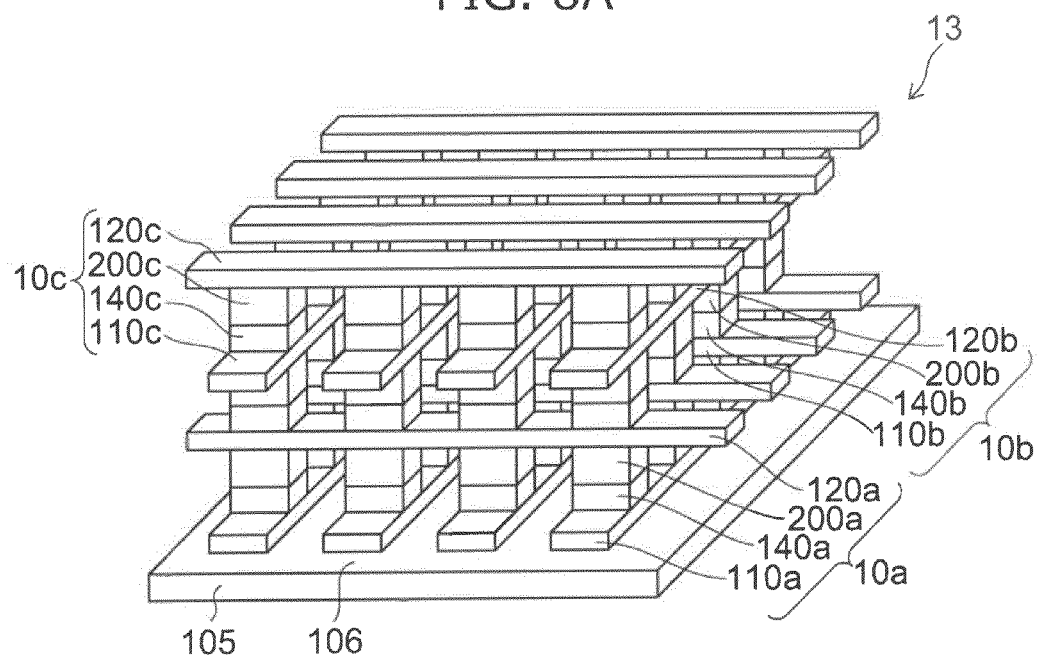

FIGS. 8A and 8B are schematic perspective views illustrating the configuration of nonvolatile memory devices according to the first embodiment of the invention.

As shown in FIG. 8A, in a nonvolatile memory device 12 according to the first embodiment, the memory portion 200 has a two-layer structure. More specifically, the memory portion 200 includes a substrate 105, a first-layer first electrode 110a provided on the major surface 106 of the substrate 105, a first-layer second electrode 120a opposed to the first-layer first electrode 110a, and a first-layer memory portion 200a provided between the first-layer first electrode 110a and the first-layer second electrode 120a. These constitute a first-layer nonvolatile memory device 10a. Furthermore, the first-layer second electrode 120a serves as a second-layer first electrode 110b, a second-layer memory portion 200b is provided thereon, and a second-layer second electrode 120b is provided thereon. These constitute a second-layer nonvolatile memory device 10b. Each layer is provided with a switching element portion 140a, 140b.

The area of at least one of the first-layer memory portion 200a and the second-layer memory portion 200b is set smaller than the area of the cross surface 130a formed by the first-layer first electrode 110a and the first-layer second electrode 120a opposed to each other, and the cross surface 130b formed by the second-layer first electrode 110b (in this case, identical to the first-layer second electrode 120a) and the second-layer second electrode 120b opposed to each other. Thus, the cross-sectional area of the memory portion 200 can be made smaller than the area of the cross surface. This can reduce the current flowing in the memory portion 200, and achieve a nonvolatile memory device with low power consumption.

Furthermore, as shown in FIG. 8B, in a nonvolatile memory device 13 according to the first embodiment, the memory portion 200 has a three-layer structure. Also in this case, the cross-sectional area of the memory portion 200 can be made smaller than the area of the cross surface 130. This can reduce the current flowing in the memory portion 200, and achieve a nonvolatile memory device with low power consumption.

In FIGS. 8A and 8B, the memory portions 200 are illustratively stacked in two layers and three layers, respectively. However, four or more layers may be stacked. Furthermore, in the foregoing, the first electrode and the second electrode are illustratively shared between the adjacent layers, but are not limited thereto. Instead, an insulating layer may be provided between the layers, and a first electrode and a second electrode may be independently provided in each layer.

In the nonvolatile memory device of this embodiment, the memory portion 200 is not limited to a resistance change element having resistance changing with the applied voltage. The memory portion 200 can be an element having various configurations, such as a phase transition element made of a chalcogenide material and switching between the amorphous phase and the crystalline phase in response to Joule heat.

In the nonvolatile memory device 90 of the comparative example illustrated in FIGS. 4A to 4C, if the width of the first electrode 110 and the second electrode 120 is set to the minimum processable line width, then the width (cross-sectional area) of the memory portion 200 is also of the size of the minimum processable line width. Hence, the cross-sectional area of the memory portion 200 is substantially equal to the area of the cross surface 130. In contrast, in the nonvolatile memory device 10, 12, 13 according to the first embodiment of the invention, even if the width of the first electrode 110 and the second electrode 120 is set to the minimum processable line width, the width (size, cross-sectional area) of the memory portion 200 can be set smaller than the minimum line width.

(Second Embodiment)

In the following, a method for manufacturing a nonvolatile memory device of a second embodiment of the invention is described.

Figure 9:
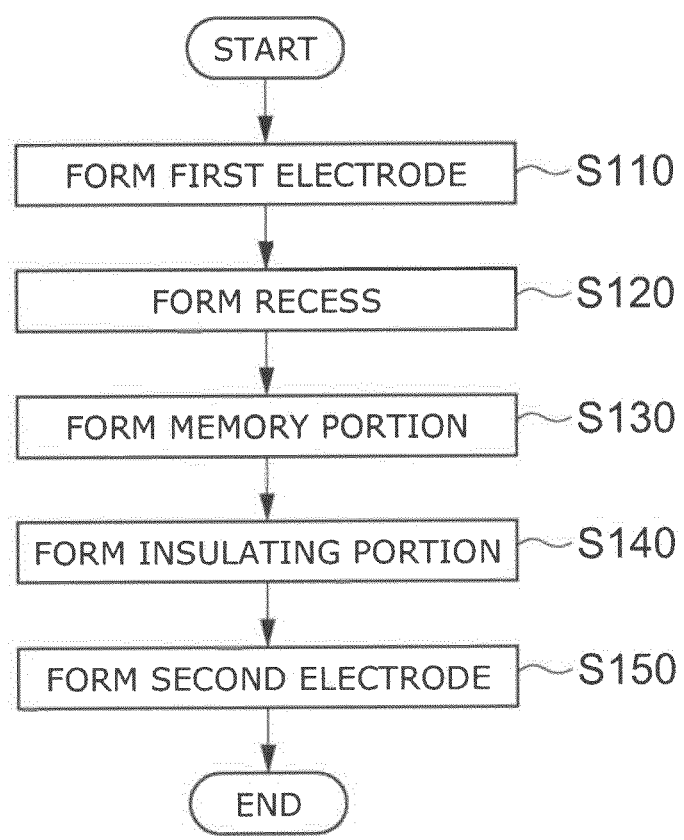
FIG. 9 is a flow chart illustrating a method for manufacturing a nonvolatile memory device according to a second embodiment of the invention.

FIG. 9 is a flow chart illustrating a method for manufacturing a nonvolatile memory device according to the second embodiment of the invention.

As shown in FIG. 9, the method for manufacturing a nonvolatile memory device according to the second embodiment of the invention starts with forming a first electrode 110 on a substrate 105 (step S110). More specifically, a first conductive film 119 constituting the first electrode 110 is formed on the substrate 105 and patterned into a prescribed shape. At this time, a switching element portion 140 may be simultaneously formed.

Here, the material of the first electrode 110 can include e.g. tungsten, tungsten silicide, or tungsten nitride.

Next, an insulating layer is formed on the substrate 105 and the first electrode 110 (and the switching element portion 140), and a recess is formed in the insulating layer (step S120). At this time, this insulating layer can be a device isolation insulating film 159 constituting a device isolation insulating portion 150. The recess is formed in a prescribed portion of this device isolation insulating film 159. Here, the recess is provided on the first electrode 110. For instance, the recess can be a strip-shaped trench formed on the first electrode 110 in the extending direction (X-axis direction) of the first electrode 110. Alternatively, the recess can be an independent hole (through hole) formed in the region where the first electrode 110 three-dimensionally crosses a second electrode 120 to be formed later.

Next, a memory portion 200 is formed inside the recess (step S130). At this time, instead of entirely filling the recess with a memory portion film 209 constituting the memory portion 200, the memory portion 200 is provided so as to leave a space inside the recess. Here, the material of the memory portion 200 can be any of various transition metal oxides having electrical resistance changing with the applied voltage or current, such as nickel oxide ($NiO_x$), titanium oxide ($TiO_x$), $ZnMn_2O_4$, and $Pr_xCa_{1-x}MnO_3$. Alternatively, the memory portion 200 can be made of a phase transition material.

Next, an insulating portion 160 is formed inside the memory portion 200 (step S140).

Next, a second electrode 120 is formed on the memory portion 200 and the insulating portion 160 (step S150). Here, the material of the second electrode 120 can include e.g. tungsten, tungsten silicide, or tungsten nitride.

Accordingly, the memory portion 200 can be formed so that the area of at least the second memory portion surface 220 opposed to the second electrode 120 is smaller than the area of the cross surface 130 formed by the first electrode 110 and the second electrode 120 opposed to each other. Furthermore, the memory portion 200 can also be formed so that the area of the first memory portion surface 210 opposed to the first electrode 110 is smaller than the area of the cross surface 130.

Thus, in the method for manufacturing a nonvolatile memory device according to the second embodiment of the invention, even if the width of the first electrode 110 and the second electrode 120 is set to the minimum processable line width, the cross-sectional area of the memory portion 200 can be set smaller than the minimum processable line width. This can reduce the current flowing in the memory portion 200, and achieve a nonvolatile memory device with low power consumption.

In the foregoing, when the cross section of the recess has the same size as the cross surface 130, if the entire region inside the recess is filled with the memory portion 200, then both the area of the first memory portion surface 210 and the area of the second memory portion surface 220 of the memory portion 200 are equal to the area of the cross surface 130. Thus, the effect of reducing the current cannot be achieved.

(Third Embodiment)

A specific description is given below.

Figure 10:
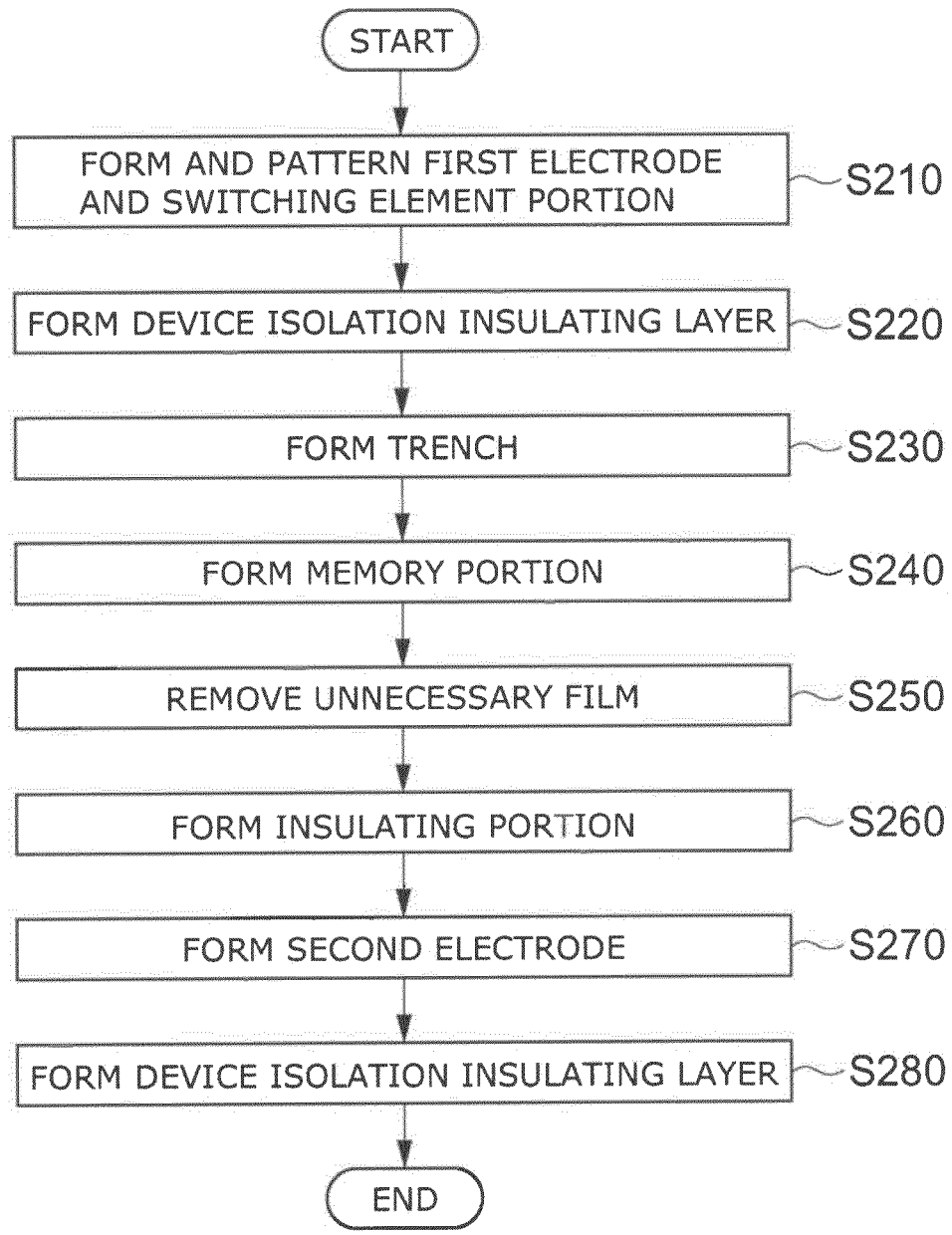
FIG. 10 is a flow chart illustrating a method for manufacturing a nonvolatile memory device according to a third embodiment of the invention.

FIG. 10 is a flow chart illustrating a method for manufacturing a nonvolatile memory device according to a third embodiment of the invention.

FIGS. 11A to 12C are process sectional views for describing the method for manufacturing a nonvolatile memory device according to the third embodiment of the invention. In FIGS. 11A to 12C, the left-side figure is a sectional view parallel to the Y-axis (A-A sectional view in FIGS. 2A and 2B), and the right-side figure is a sectional view parallel to the X-axis (B-B sectional view in FIGS. 2A and 2B).

Figure 11A:
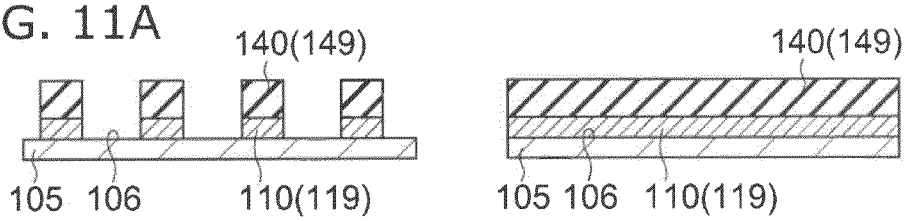
FIGS. 11A to 11E are process sectional views for describing the method for manufacturing a nonvolatile memory device according to the third embodiment of the invention.

As shown in FIG. 11A, first, a film (first conductive film 119) for the first electrode 110 and a film (switching element film 149) constituting the switching element portion 140 are formed on the major surface 106 of a substrate 105 made of silicon. These films are patterned by using e.g. photolithography and dry etching (step S210 shown in FIG. 10). At this time, the patterning is performed so that the first electrode 110 extends in the direction parallel to the X-axis.

Here, the material of the first electrode 110 can include e.g. tungsten, tungsten silicide, or tungsten nitride.

Figure 11B:
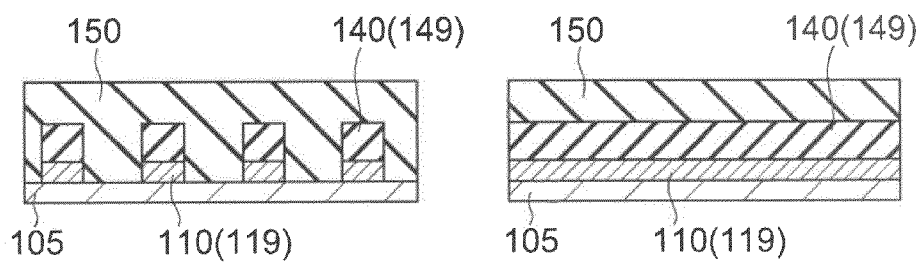

Next, as shown in FIG. 11B, a film (device isolation insulating film 159) constituting the device isolation insulating portion 150 is formed by CVD (chemical vapor deposition) or the coating process. The surface is planarized by the CMP (chemical mechanical polishing) process as necessary (step S220 shown in FIG. 10).

Figure 11C:
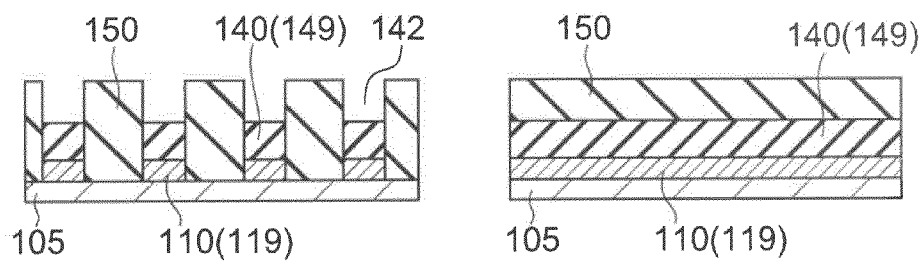

Next, as shown in FIG. 11C, for instance, by photolithography and dry etching, part of the device isolation insulating film 159 is etched to form a trench 142 as a recess so that the trench 142 reaches the switching element portion 140 (step S230 shown in FIG. 10). The trench 142 can be shaped like a groove extending in the X direction, i.e., the longitudinal direction of the first electrode 110.

Figure 11D:
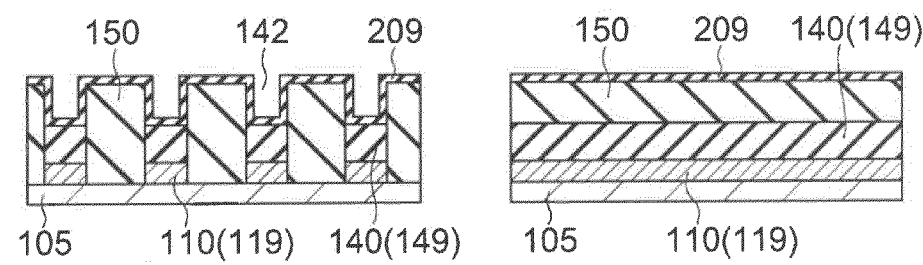

Next, as shown in FIG. 11D, a film (memory portion film 209) for the memory portion 200 is formed on the sidewall of the trench 142 by the CVD process, ALD (atomic layer deposition) process, or sputtering process (step S240 shown in FIG. 10). Here, the material of the memory portion 200 can be any of various transition metal oxides having electrical resistance changing with the applied voltage or current, such as nickel oxide ($NiO_x$), titanium oxide ($TiO_x$), $ZnMn_2O_4$, and $Pr_xCa_{1-x}MnO_3$. Alternatively, the memory portion 200 can be made of a phase transition material.

Figure 11E:
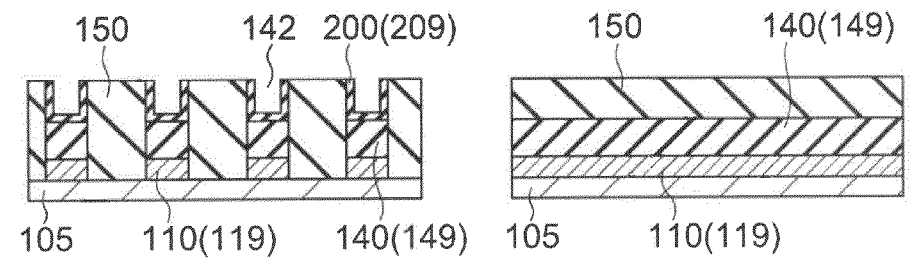

Next, as shown in FIG. 11E, the unnecessary portion of the memory portion film 209 deposited on the bottom surface of the trench 142 and the upper surface of the device isolation insulating portion 150 in step S240 is removed by the CMP process or etch-back based on dry etching so as to leave the portion necessary for constituting the memory portion 200 in the trench 142 (step S250 shown in FIG. 10).

Figure 12A:
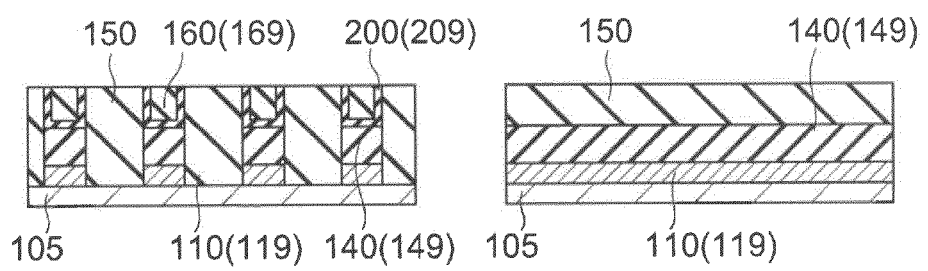
FIGS. 12A to 12C are process sectional views following FIG. 11E.

Next, as shown in FIG. 12A, the remaining space of the recess surrounded by the memory portion 200 formed inside the trench 142 is filled with a film (insulating portion film 169) constituting the insulating portion 160 by forming e.g. an insulating material such as $SiO_2$ using the CVD process or ALD process. The surface is planarized by using the CMP process. Thus, the insulating portion 160 is formed (step S260 shown in FIG. 10).

Figure 12B:
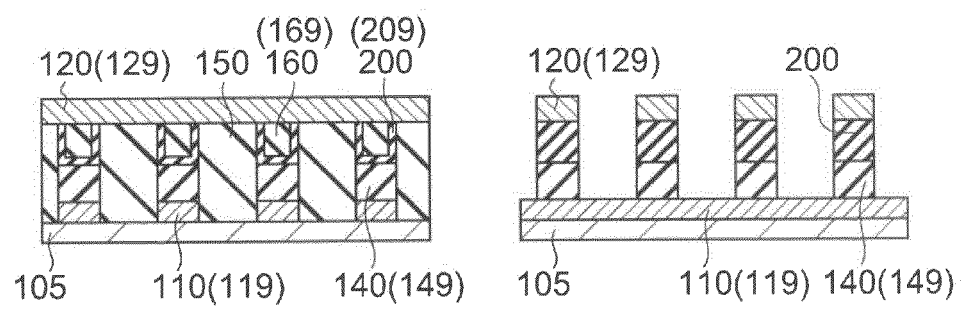

Next, as shown in FIG. 12B, a film (second conductive film 129) for the second electrode 120 is formed by sputtering or CVD. Then, for instance, by photolithography and dry etching, the second conductive film 129, the memory portion film 209, the switching element film 149, and the insulating portion film 169 are patterned (step S270 shown in FIG. 10). Here, the material of the second electrode 120 can include e.g. tungsten, tungsten silicide, or tungsten nitride. At this time, the patterning is performed so as to be generally orthogonal to the patterning direction of step S210, i.e., so that the second electrode 120 extends in the Y-axis direction.

Figure 12C:
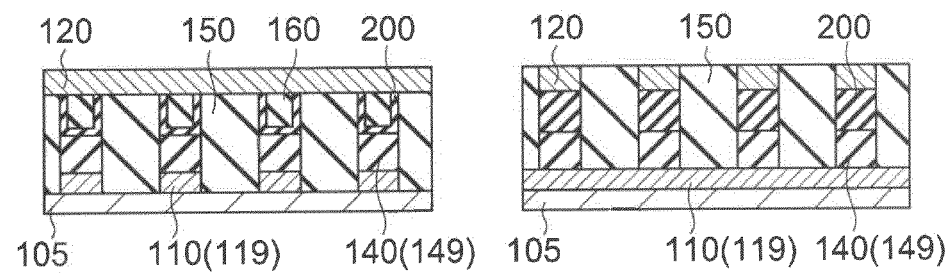

Next, as shown in FIG. 12C, as a film (device isolation insulating film 159) constituting the device isolation insulating portion 150, for instance, a $SiO_2$ film is formed by the CVD process or coating process so as to fill the space between the memory portion 200 and the like. The surface is planarized by the CMP process as necessary (step S280 shown in FIG. 10).

Thus, the nonvolatile memory device 10 illustrated in FIGS. 1, 2A, and 2B can be formed. Here, the memory portion 200 is shaped as illustrated in FIGS. 3B, 5A, and 5B.

That is, the memory portion 200 is formed in a damascene structure. The memory portion film 209 is formed only on the sidewall portion (and bottom portion) of the trench 142, instead of entirely filling the trench 142. Hence, the area of at least the second memory portion surface 220 of the memory portion 200 can be made smaller than the area of the cross surface 130.

Thus, in the method for manufacturing a nonvolatile memory device according to the third embodiment of the invention, even if the width of the first electrode 110 and the second electrode 120 is set to the minimum processable line width, the cross-sectional area of the memory portion 200 can be set smaller than the minimum processable line width. This can reduce the current flowing in the memory portion 200, and achieve a nonvolatile memory device with low power consumption.

(Fourth Embodiment)

Next, a nonvolatile memory device of a fourth embodiment of the invention is described.

Figure 13:
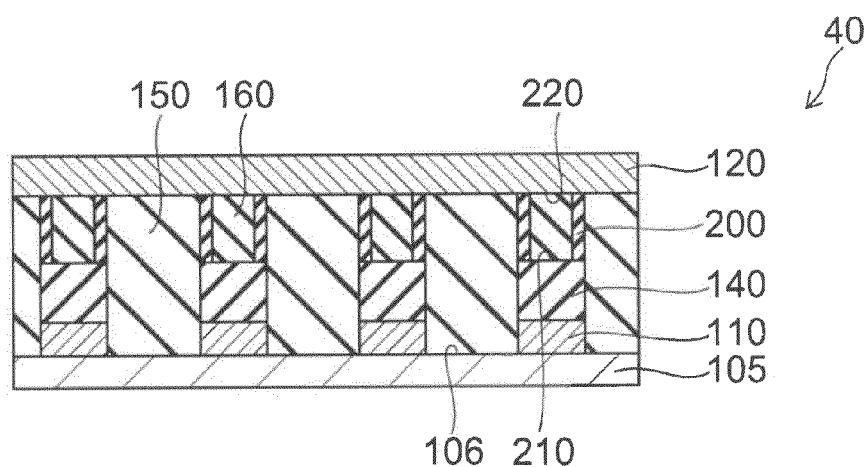
FIG. 13 is a schematic sectional view illustrating the configuration of a nonvolatile memory device according to a fourth embodiment of the invention.

FIG. 13 is a schematic sectional view illustrating the configuration of a nonvolatile memory device according to a fourth embodiment of the invention.

As shown in FIG. 13, in the nonvolatile memory device 40 of the fourth embodiment, both the area of the first memory portion surface 210 of the memory portion 200 opposed to the first electrode 110 and the area of the second memory portion surface 220 of the memory portion 200 opposed to the second electrode 120 are set smaller than the area of the cross surface 130 formed by the first electrode 110 and the second electrode 120 opposed to each other. That is, as illustrate in FIG. 5A, the memory portion 200 includes a first sidewall portion 221 and a second sidewall portion 222 throughout the vertical direction (layer thickness direction) of the memory portion 200. The first sidewall portion 221 and the second sidewall portion 222, respectively, correspond to the first edge 111 and the second edge 112 of the first electrode 110 in the cross surface 130. Furthermore, the space between the first sidewall portion 221 and the second sidewall portion 222 is filled with an insulating portion 160.

Here, the first electrode 110 and the second electrode 120 can be made of e.g. tungsten, tungsten silicide, or tungsten nitride.

The memory portion 200 can be made of various transition metal oxides having electrical resistance changing with the applied voltage or current, such as nickel oxide ($NiO_x$), titanium oxide ($TiO_x$), $ZnMn_2O_4$, and $Pr_xCa_{1-x}MnO_3$. Alternatively, the memory portion 200 can be made of a phase transition material.

The nonvolatile memory device 40 of the fourth embodiment illustrated in FIG. 13 can be formed as follows.

Figure 14:
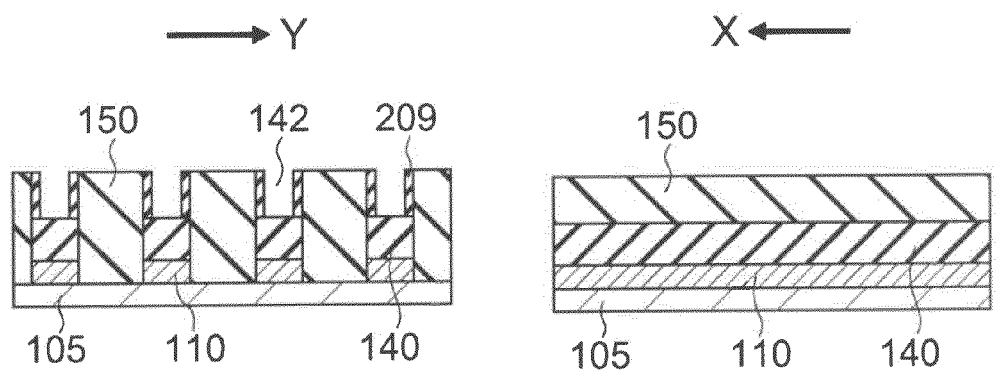
FIG. 14 is a process sectional view illustrating a method for manufacturing the nonvolatile memory device according to the fourth embodiment of the invention.

FIG. 14 is a process sectional view illustrating a method for manufacturing the nonvolatile memory device according to the fourth embodiment of the invention.

In FIG. 14, the left-side figure is a sectional view parallel to the Y-axis (A-A sectional view in FIGS. 2A and 2B), and the right-side figure is a sectional view parallel to the X-axis (B-B sectional view in FIGS. 2A and 2B). In this method, the process until forming the memory portion film 209 is similar to the process until step S240 (FIG. 11D) shown in FIG. 10, and hence is not shown.

After the memory portion film 209 is formed on the sidewall (and bottom surface) of the trench 142 (and the upper surface of the device isolation insulating portion 150), as shown in FIG. 14, the unnecessary film deposited on the bottom surface of the trench 142 and the upper surface of the device isolation insulating portion 150 is removed by e.g. etch-back based on dry etching. At this time, the memory portion film 209 deposited on the bottom surface of the trench 142 is completely removed. Thus, the memory portion 200 can be formed only on the sidewall portion of the trench 142.

Subsequently, by a method similar to that in FIGS. 12A to 12C, an insulating portion 160, a second electrode 120, and a device isolation insulating portion 150 are formed. Thus, the nonvolatile memory device 40 of this embodiment illustrated in FIG. 13 can be formed. Here, the memory portion 200 is shaped as illustrated in FIG. 5A.

Thus, in the method for manufacturing a nonvolatile memory device according to the fourth embodiment of the invention, even if the width of the first electrode 110 and the second electrode 120 is set to the minimum processable line width, the cross-sectional area of the memory portion 200 can be set smaller than the minimum processable line width. This can reduce the current flowing in the memory portion 200, and achieve a nonvolatile memory device with low power consumption.

(Fifth Embodiment)

Next, a fifth embodiment of the invention is described. In a nonvolatile memory device and a method for manufacturing the same of the fifth embodiment, the groove-like trench 142 in the third embodiment illustrated in FIGS. 10 to 12C is changed to a through hole.

Figure 15:
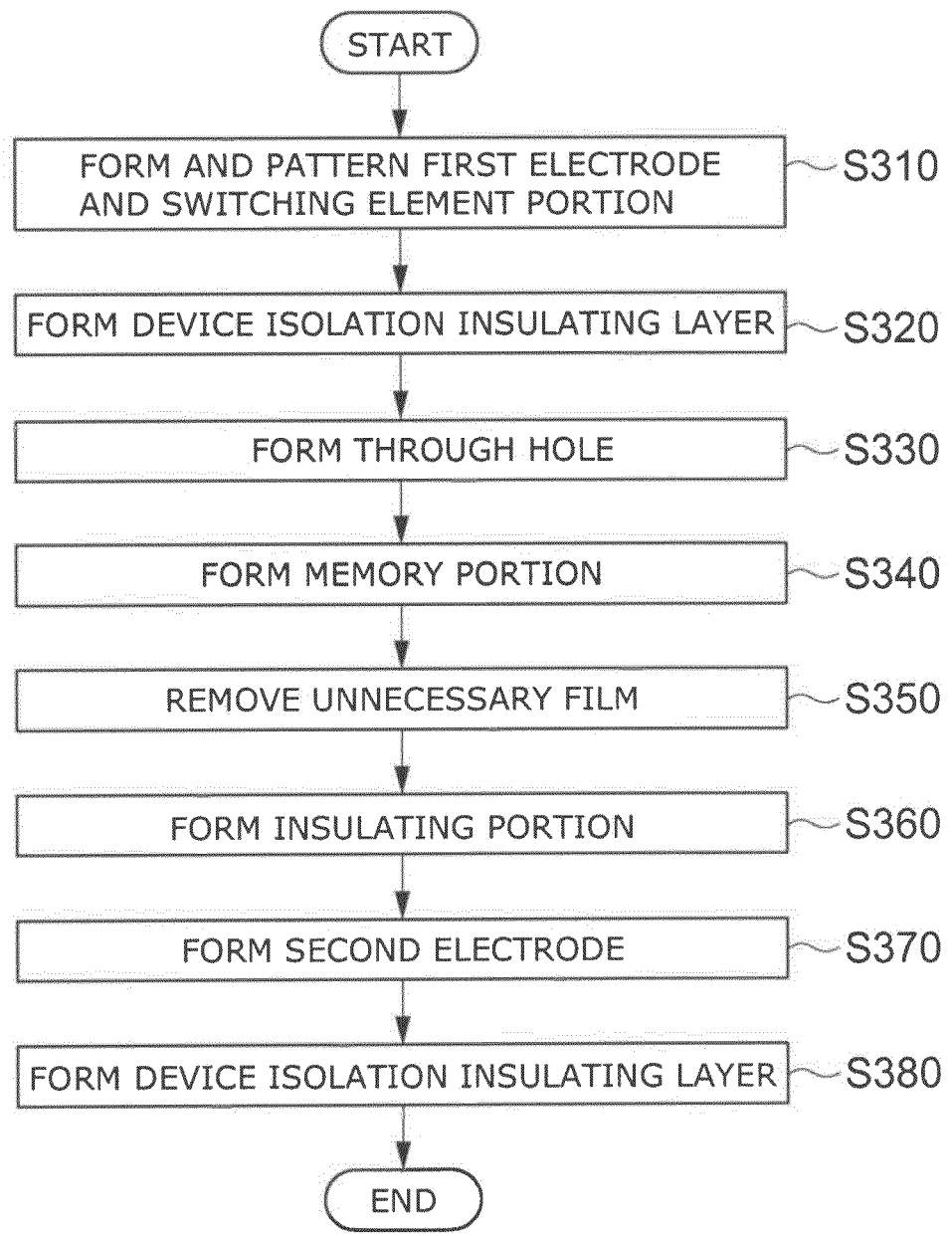
FIG. 15 is a flow chart illustrating a method for manufacturing a nonvolatile memory device according to a fifth embodiment of the invention.

FIG. 15 is a flow chart illustrating a method for manufacturing a nonvolatile memory device according to a fifth embodiment of the invention.

FIGS. 16A to 17C are process sectional views for describing the method for manufacturing a nonvolatile memory device according to the fifth embodiment of the invention. In FIGS. 16A to 17C, the left-side figure is a sectional view parallel to the Y-axis (A-A sectional view in FIGS. 2A and 2B), and the right-side figure is a sectional view parallel to the X-axis (B-B sectional view in FIGS. 2A and 2B).

The process until forming the first electrode 110, the switching element portion 140, and the device isolation insulating portion 150 on the major surface 106 of the substrate 105 is similar to that in FIGS. 11A and 11B, and hence is not shown. The process subsequent thereto is described.

Figure 16A:
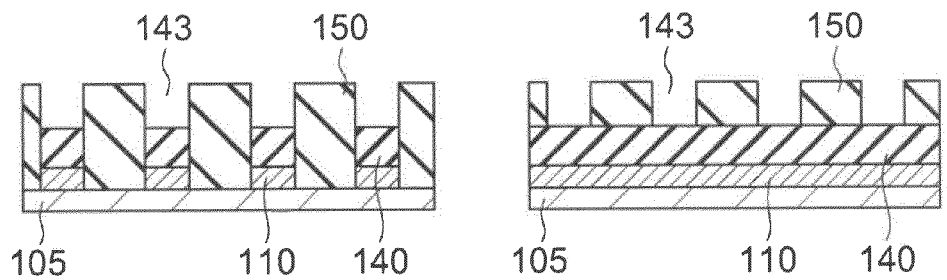
FIGS. 16A to 16C are process sectional views for describing the method for manufacturing a nonvolatile memory device according to the fifth embodiment of the invention.

As shown in FIG. 16A, for instance, by photolithography and dry etching, a through hole 143 is formed in the device isolation insulating portion 150 (step S330 shown in FIG. 15). This through hole 143 is provided in the region where the first electrode 110 three-dimensionally crosses a second electrode 120 to be provided later.

Figure 16B:
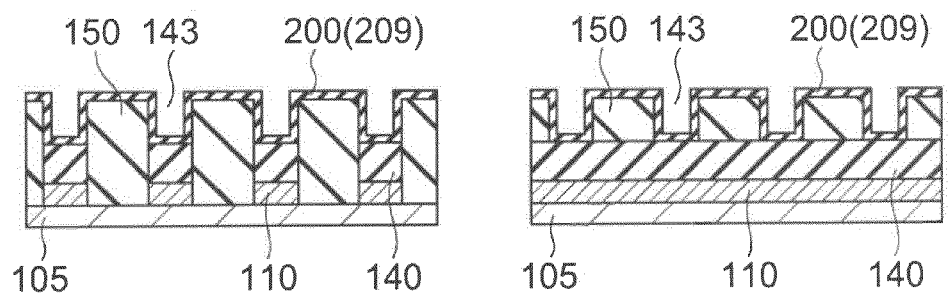

Next, as shown in FIG. 16B, a film (memory portion film 209) for the memory portion 200 is formed on the sidewall of the through hole 143 by the CVD process, ALD process, or sputtering process (step S340 shown in FIG. 15).

Figure 16C:
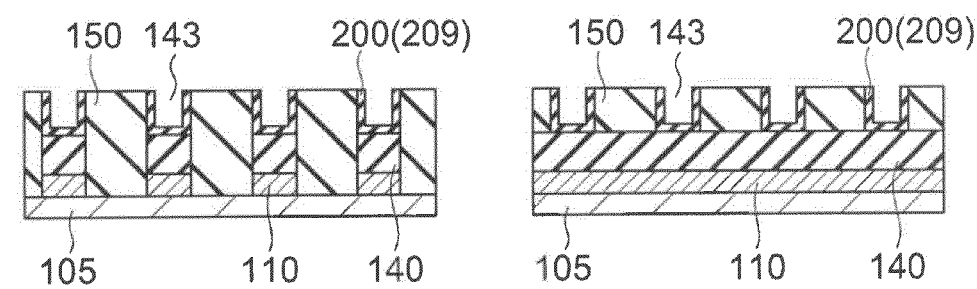

Next, as shown in FIG. 16C, the unnecessary film deposited on the bottom surface of the through hole 143 and the upper surface of the device isolation insulating portion 150 in step S340 is removed by the CMP process or the etch-back process (step S350 shown in FIG. 15).

Figure 17A:
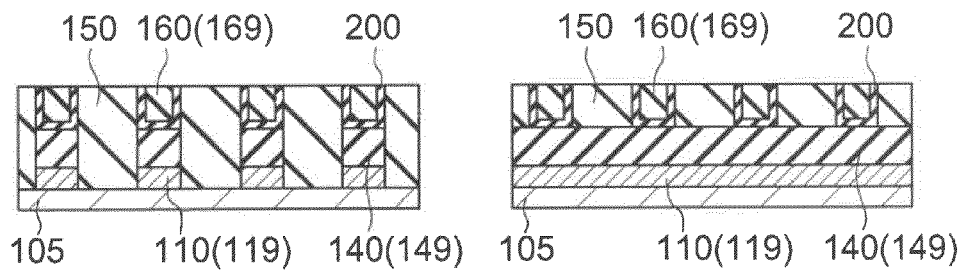
FIGS. 17A to 17C are process sectional views following FIG. 16C.

Next, as shown in FIG. 17A, inside the memory portion 200 formed inside the through hole 143, an insulating material such as $SiO_2$ is formed as a film (insulating portion film 169) constituting the insulating portion 160. The surface is planarized by using the CMP process. Thus, the insulating portion 160 is formed (step S360 shown in FIG. 15).

Figure 17B:
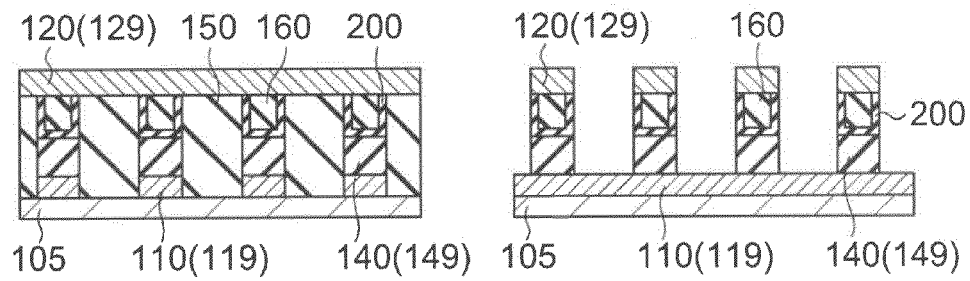

Next, as shown in FIG. 17B, a film (second conductive film 129) for the second electrode 120 is formed. Then, the second conductive film 129 and the switching element film 149 are patterned (step S370 shown in FIG. 15).

Figure 17C:
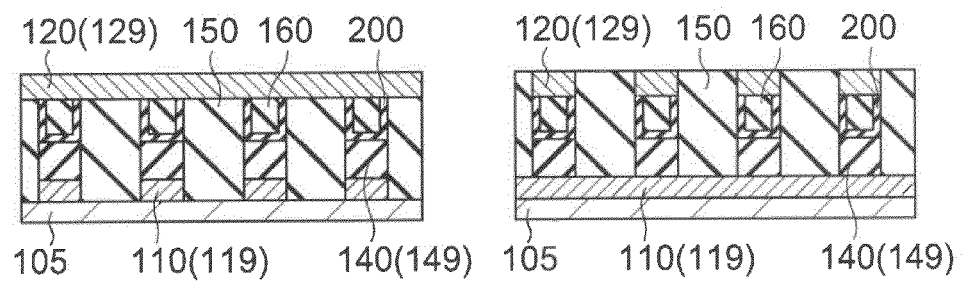

Next, as shown in FIG. 17C, a film (device isolation insulating film 159) constituting the device isolation insulating portion 150 is formed by the CVD process or coating process. The surface is planarized by the CMP process as necessary (step S380 shown in FIG. 15).

Thus, the nonvolatile memory device according to the embodiment of the invention can be formed. Here, the memory portion 200 is shaped as illustrated in FIGS. 5D or 7A to 7G. That is, the memory portion 200 shaped like an annular column can be formed.

That is, the memory portion 200 is formed in a damascene structure. The memory portion film 209 is formed only on the sidewall portion (and bottom portion) of the through hole, instead of entirely filling the through hole 143. Hence, the area of at least the second memory portion surface 220 of the memory portion 200 can be made smaller than the area of the cross surface 130.

Here, the first electrode 110 and the second electrode 120 can be made of e.g. tungsten, tungsten silicide, or tungsten nitride.

The memory portion 200 can be made of various transition metal oxides having electrical resistance changing with the applied voltage or current, such as nickel oxide (NiO$_x$), titanium oxide (TiO$_x$), ZnMn$_2$O$_4$, and Pr$_x$Ca$_{1-x}$MnO$_3$. Alternatively, the memory portion 200 can be made of a phase transition material.

Thus, in the method for manufacturing a nonvolatile memory device according to the fifth embodiment of the invention, even if the width of the first electrode 110 and the second electrode 120 is set to the minimum processable line width, the cross-sectional area of the memory portion 200 can be set smaller than the minimum processable line width. This can reduce the current flowing in the memory portion 200, and achieve a nonvolatile memory device with low power consumption.

(Sixth Embodiment)

Next, a nonvolatile memory device of a sixth embodiment of the invention is described.

Figure 18:
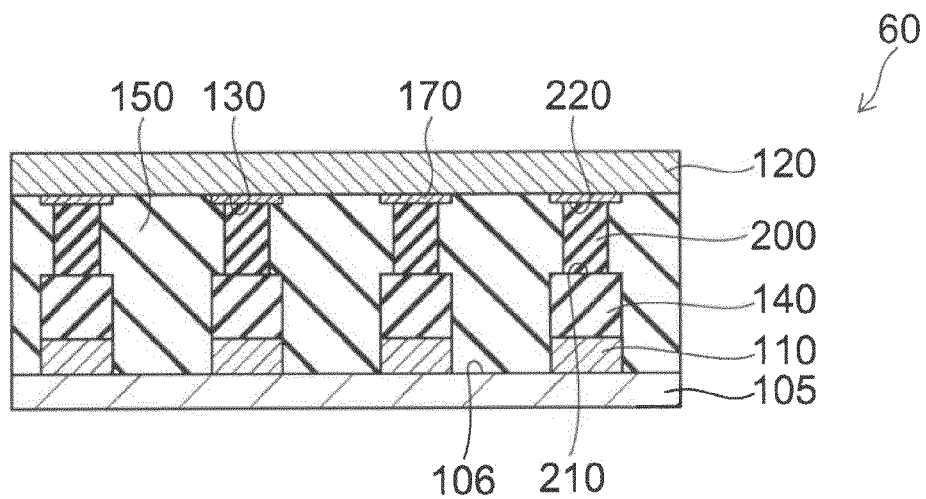
FIG. 18 is a schematic sectional view illustrating the configuration of a nonvolatile memory device according to a sixth embodiment of the invention.

FIG. 18 is a schematic sectional view illustrating the configuration of a nonvolatile memory device according to a sixth embodiment of the invention.

As shown in FIG. 18, in the nonvolatile memory device of the sixth embodiment, a memory portion 200 is illustratively provided in the internal region of a columnar body having an upper surface and a lower surface given by the cross surfaces 130 formed by the first electrode 110 and the second electrode 120 opposed to each other. That is, the memory portion 200 has a shape and arrangement illustrated in FIGS. 6A to 6M described above.

Furthermore, a cap layer 170 is provided between the memory portion 200 and the second electrode 120. In the rectangular solid having an upper surface and a lower surface given by the cross surfaces 130, the region not provided with the memory portion 200 is filled with a device isolation insulating portion 150.

The nonvolatile memory device 60 of the sixth embodiment illustrated in FIG. 18 can be formed as follows.

Figure 19:
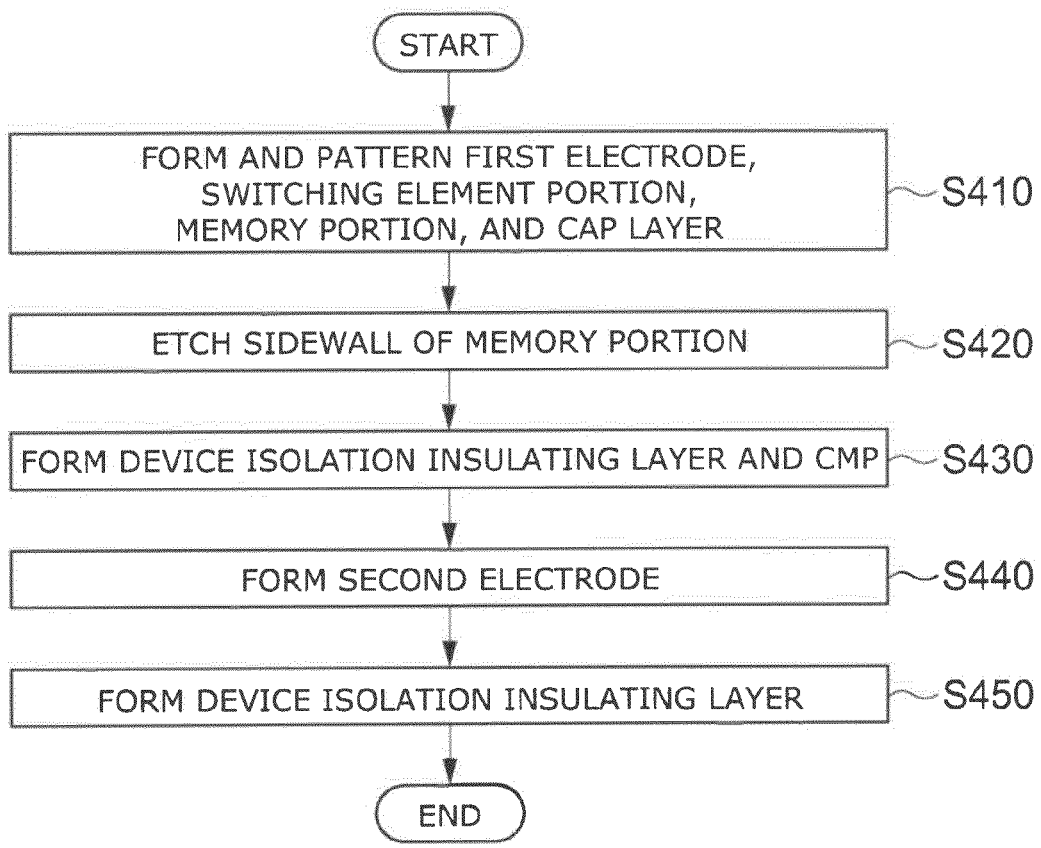
FIG. 19 is a flow chart illustrating a method for manufacturing the nonvolatile memory device according to the sixth embodiment of the invention.
Figure 20:
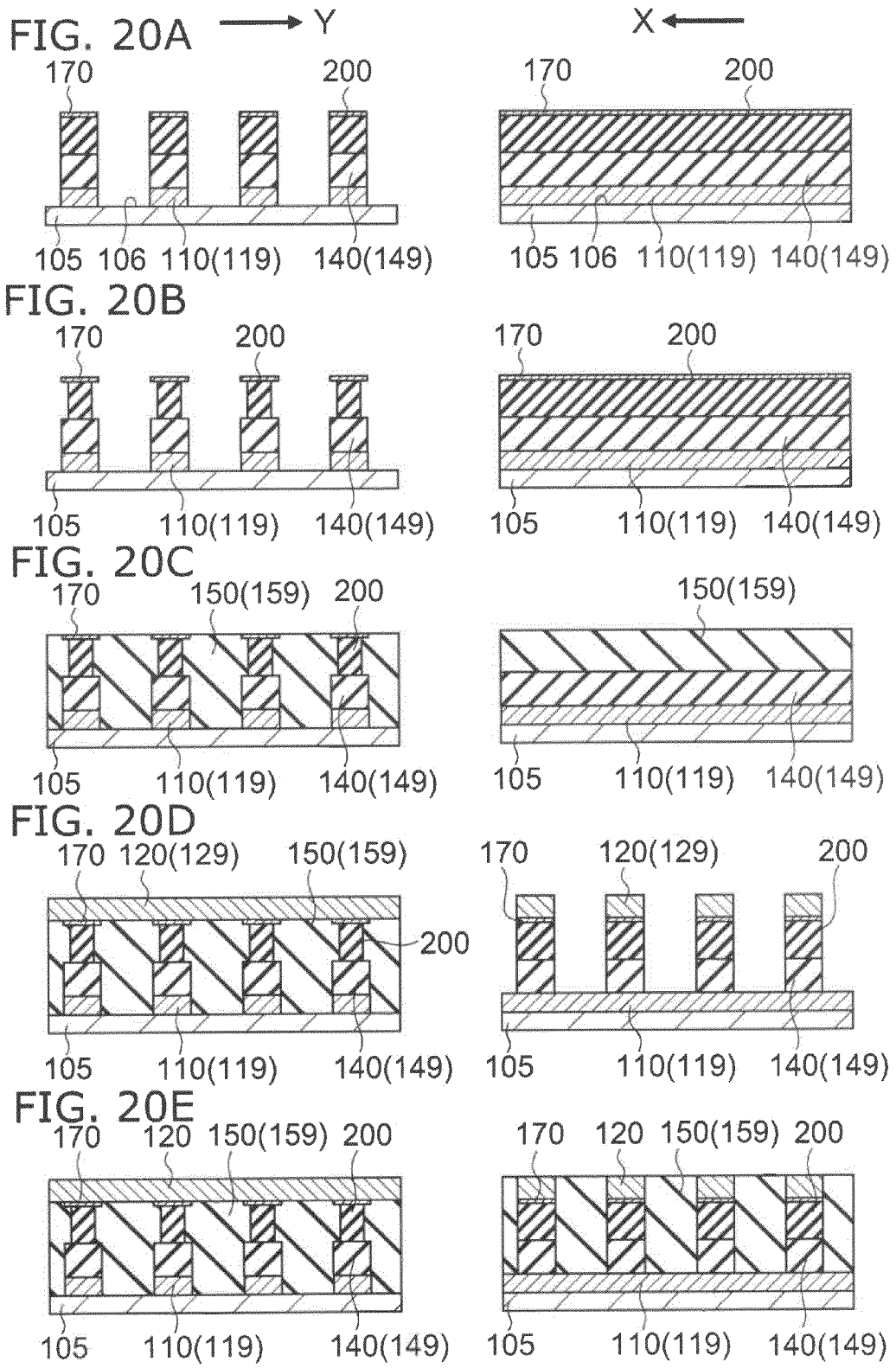
FIGS. 20A to 20E are process sectional views for describing the method for manufacturing the nonvolatile memory device according to the sixth embodiment of the invention.

FIG. 19 is a flow chart illustrating a method for manufacturing the nonvolatile memory device according to the sixth embodiment of the invention.

FIGS. 20A to 20E are process sectional views for describing the method for manufacturing the nonvolatile memory device according to the sixth embodiment of the invention. In FIGS. 20A to 20E, the left-side figure is a sectional view parallel to the Y-axis (A-A sectional view in FIGS. 2A and 2B), and the right-side figure is a sectional view parallel to the X-axis (B-B sectional view in FIGS. 2A and 2B).

As shown in FIG. 20A, first, a film (first conductive film 119) for the first electrode 110, a film (switching element film 149) constituting the switching element portion 140, a film (memory portion film 209) for the memory portion 200, and a film (cap film 179) constituting the cap layer 170 are formed on the major surface 106 of a substrate 105 made of silicon. These films are patterned by using e.g. photolithography and dry etching (step S410 shown in FIG. 19). At this time, the patterning is performed so that the first electrode 110 extends in the direction parallel to the X-axis.

Here, the first electrode 110 and the second electrode 120 can be made of e.g. tungsten, tungsten silicide, or tungsten nitride.

The memory portion 200 can be made of any of various transition metal oxides having electrical resistance changing with the applied voltage or current, such as nickel oxide (NiO$_x$), titanium oxide (TiO$_x$), ZnMn$_2$O$_4$, and Pr$_x$Ca$_{1-x}$MnO$_3$. Alternatively, the memory portion 200 can be made of a phase transition material.

Next, as shown in FIG. 20B, the sidewall of the memory portion 200 is etched back (step S420 shown in FIG. 19). This may be performed by e.g. wet etching, or by e.g. dry etching with plasma radicals.

For instance, in the case where the memory portion 200 is made of ZnMn$_2$O$_4$, acid solutions of hydrofluoric acid, hydrochloric acid, nitric acid, or sulfuric acid, various alkaline solutions, aqueous salt solutions of ammonium fluoride or buffered hydrofluoric acid, and vapor hydrofluoric acid can be used to selectively dissolve the memory portion 200. Thus, the sidewall of the memory portion 200 can be recessed to reduce the cross-sectional area of the memory portion 200.

In the case where the memory portion 200 is made of NiO, acid solutions of hydrofluoric acid, hydrochloric acid, nitric acid, or sulfuric acid, ammonium hydroxide (NH$_4$OH), and aqueous salt solutions of ammonium fluoride or buffered hydrofluoric acid can be used to selectively dissolve the memory portion 200. Thus, the sidewall of the memory portion 200 can be recessed to reduce the cross-sectional area of the memory portion 200.

In the case where the memory portion 200 is made of NbO, acid solutions of hydrofluoric acid, hydrochloric acid, nitric acid, or sulfuric acid, and various alkaline solutions can be used to selectively dissolve the memory portion 200. Thus, the sidewall of the memory portion 200 can be recessed to reduce the cross-sectional area of the memory portion 200.

In the case where the memory portion 200 is made of Al$_2$O$_3$, acid solutions of hydrofluoric acid, hydrochloric acid, nitric acid, or sulfuric acid, various alkaline solutions, cold water, hot water, and aqueous salt solutions of ammonium fluoride or buffered hydrofluoric acid can be used to selectively dissolve the memory portion 200. Thus, the sidewall of the memory portion 200 can be recessed to reduce the cross-sectional area of the memory portion 200.

In the case where the memory portion 200 is made of a carbon-based material, a plasma containing oxygen, hydrogen, water, and ammonia can be used to selectively etch the memory portion 200. Thus, the sidewall of the memory portion 200 can be recessed to reduce the cross-sectional area of the memory portion 200. The carbon-based material can include amorphous carbon. A film of the carbon-based material can be formed by various techniques such as sputtering and CVD.

Next, as shown in FIG. 20C, for instance, a SiO$_2$ film is formed by the CVD process or coating process as a film (device isolation insulating film 159) constituting the device isolation insulating portion 150 to fill the space between the memory portion 200 and the like, and is planarized by CMP (step S430 shown in FIG. 19).

Next, as shown in FIG. 20D, a film (second conductive film 129) constituting the second electrode 120 is formed. Then, for instance, by photolithography and dry etching, the second electrode 120, the memory portion 200, and the switching element portion 140 are patterned (step S440 shown in FIG. 19).

Next, as shown in FIG. 20E, for instance, a SiO$_2$ film is formed by the CVD process or coating process as a film (device isolation insulating film 159) constituting the device isolation insulating portion 150 to fill the space between the memory portion 200 and the like. The surface is planarized by the CMP process as necessary (step S450 shown in FIG. 19).

Thus, the nonvolatile memory device 60 illustrated in FIG. 18 can be formed. Here, the memory portion 200 is shaped as illustrated in FIGS. 6A to 6C.

Thus, depending on the material of the first conductive film 119, the switching element film 149, the memory portion film 209, and the cap film 179 (and the barrier metal layer and the like, not shown), suitable chemicals and gases can be selected to selectively etch only the memory portion film 209. Accordingly, the cross-sectional area of the memory portion 200 can be reduced. That is, at least one of the area of the first memory portion surface 210 and the area of the second memory portion surface 220 can be made smaller than the area of the cross surface 130.

Thus, in the method for manufacturing a nonvolatile memory device according to the sixth embodiment of the invention, even if the width of the first electrode 110 and the second electrode 120 is set to the minimum processable line width, the cross-sectional area of the memory portion 200 can be set smaller than the minimum processable line width. This can reduce the current flowing in the memory portion 200, and achieve a nonvolatile memory device with low power consumption.

In the foregoing, the cap layer 170 may be provided as necessary, and can be omitted.

(Seventh Embodiment)

Next, a nonvolatile memory device and a method for manufacturing the same of a seventh embodiment of the invention are described.

In the nonvolatile memory device and the method for manufacturing the same of the seventh embodiment, step S440 (FIG. 20D) shown in FIG. 19 is followed by a second iteration of etching the sidewall of the memory portion 200.

Figure 21:
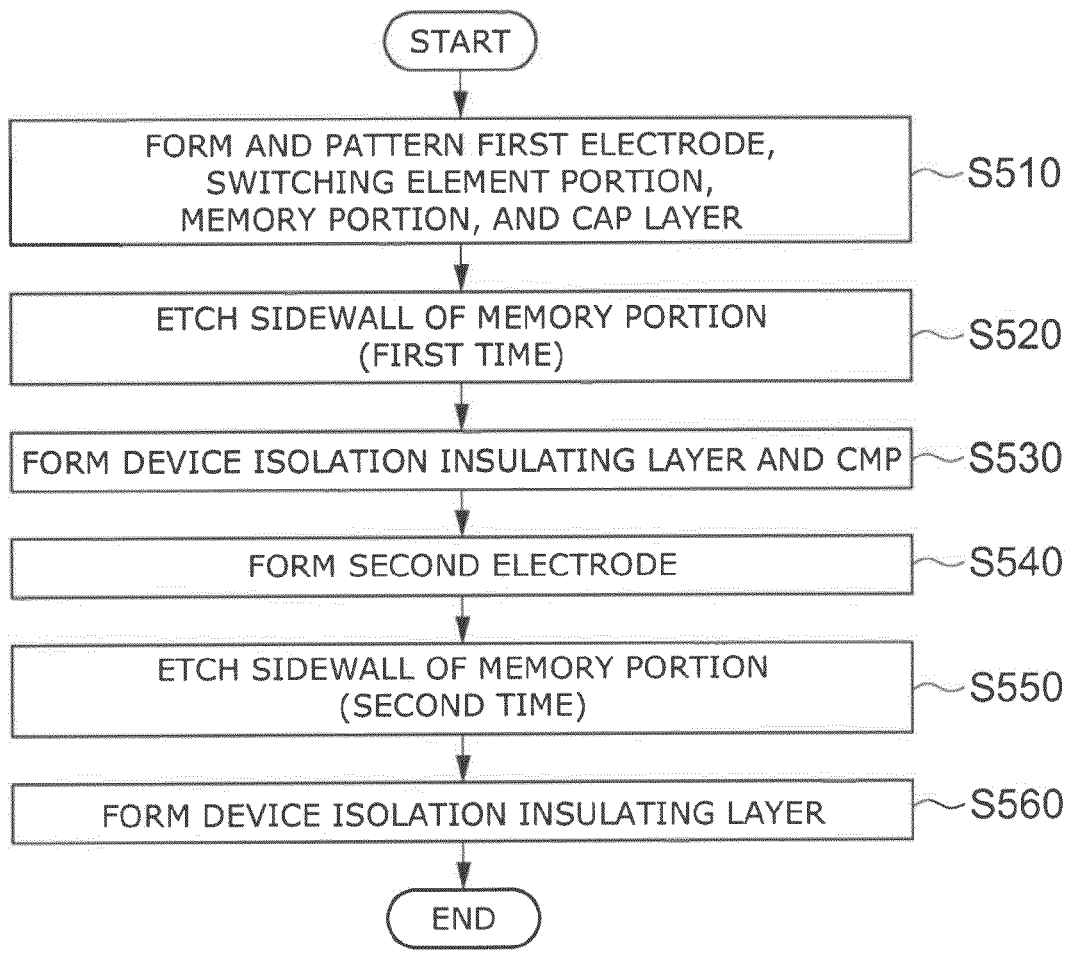
FIG. 21 is a flow chart illustrating a method for manufacturing a nonvolatile memory device according to a seventh embodiment of the invention.

FIG. 21 is a flow chart illustrating a method for manufacturing a nonvolatile memory device according to the seventh embodiment of the invention.

Figure 22A:
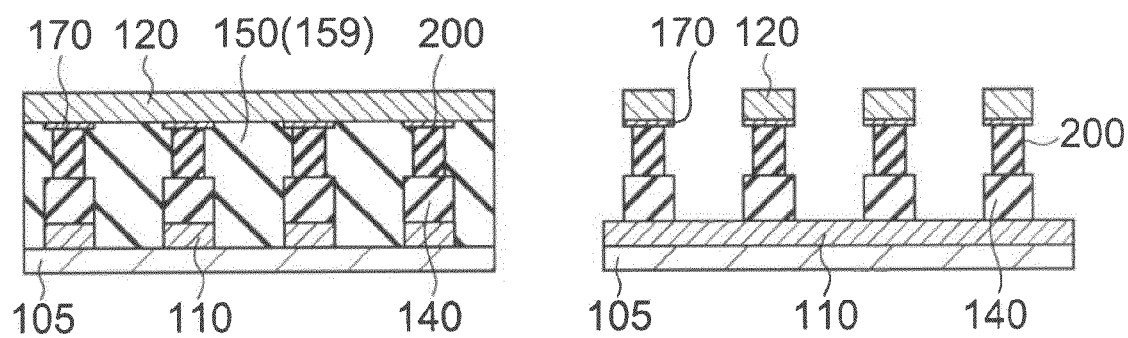
FIGS. 22A and 22B are partial process sectional views for describing the method for manufacturing a nonvolatile memory device according to the seventh embodiment of the invention.
Figure 22B:
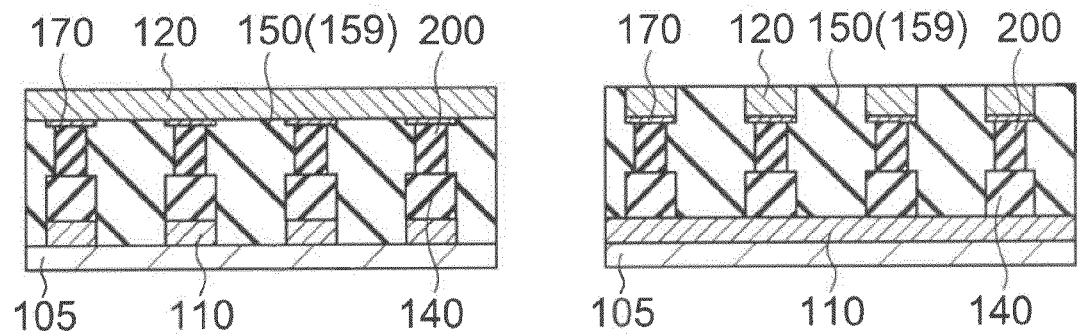

FIGS. 22A and 22B are partial process sectional views for describing the method for manufacturing a nonvolatile memory device according to the seventh embodiment of the invention.

In the flow chart illustrated in FIG. 21, the process from step S510 to step S540 is the same as the process from step S410 to step S440 of the flow chart illustrated in FIG. 19, and hence the description thereof is omitted. In the process sectional views of FIGS. 22A and 22B, the process until step S440 (FIG. 20D) shown in FIG. 19 is similar and hence omitted, and the process subsequent thereto is shown. In FIGS. 22A and 22B, the left-side figure is a sectional view parallel to the Y-axis (A-A sectional view in FIGS. 2A and 2B), and the right-side figure is a sectional view parallel to the X-axis (B-B sectional view in FIGS. 2A and 2B).

As shown in FIG. 22A, the film (second conductive film 129) constituting the second electrode 120, the memory portion 200, and the switching element portion 140 are patterned. Then, a second sidewall etching process for selectively etching the sidewall of the memory portion 200 is performed (step S550 shown in FIG. 21). This second sidewall etching process can also be performed by using various processes such as wet etching, or dry etching with plasma radicals. Thus, the sidewall of the memory portion 200 in the extending direction of the second electrode 120 (the direction parallel to the Y direction) can be etched. Accordingly, the shape of the memory portion 200 illustrated in FIGS. 6G to 6I can be realized.

Next, as shown in FIG. 22B, a film (device isolation insulating film 159) constituting the device isolation insulating portion 150 is formed by the CVD process or coating process. The surface is planarized by the CMP process as necessary (step S560 shown in FIG. 21).

Accordingly, the cross-sectional area of the memory portion 200 can be reduced. That is, at least one of the area of the first memory portion surface 210 and the area of the second memory portion surface 220 can be made smaller than the area of the cross surface 130.

Thus, various shapes of the memory portion 200 illustrated in e.g. FIGS. 6G to 6M and 7H to 7L can be obtained.

Thus, in the method for manufacturing a nonvolatile memory device according to the seventh embodiment of the invention, even if the width of the first electrode 110 and the second electrode 120 is set to the minimum processable line width, the cross-sectional area of the memory portion 200 can be set smaller than the minimum processable line width. This can reduce the current flowing in the memory portion 200, and achieve a nonvolatile memory device with low power consumption.

In the flow chart of FIG. 21, step S520 can be omitted. In this case, the memory portion 200 is etched only at the sidewall in the extending direction of the second electrode 120 in step S550. Thus, the memory portion 200 is shaped as in FIGS. 6D to 6F described above.

Accordingly, the cross-sectional area of the memory portion 200 can be reduced. That is, at least one of the area of the first memory portion surface 210 and the area of the second memory portion surface 220 can be made smaller than the area of the cross surface 130.

Also in this case, even if the width of the first electrode 110 and the second electrode 120 is set to the minimum processable line width, the cross-sectional area of the memory portion 200 can be set smaller than the minimum processable line width. This can reduce the current flowing in the memory portion 200, and achieve a nonvolatile memory device with low power consumption.

The above manufacturing method can be modified as follows.

FIGS. 23A to 23D are partial process sectional views for describing an alternative method for manufacturing a nonvolatile memory device according to the seventh embodiment of the invention.

Figure 23A:
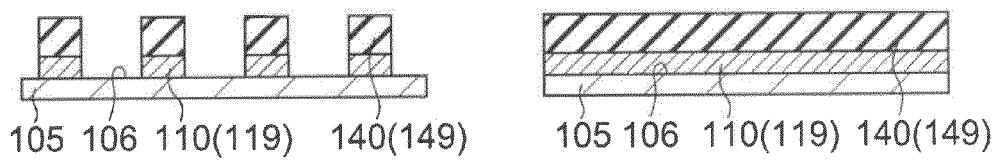
FIGS. 23A to 23D are partial process sectional views for describing an alternative method for manufacturing a nonvolatile memory device according to the seventh embodiment of the invention.

As shown in FIG. 23A, first, a film (first conductive film 119) for the first electrode 110 and a film (switching element film 149) constituting the switching element portion 140 are formed on the major surface 106 of a substrate 105 made of silicon. These films are patterned by using e.g. photolithography and dry etching. At this time, the patterning is performed so that the first electrode 110 extends in the direction parallel to the X-axis.

Figure 23B:
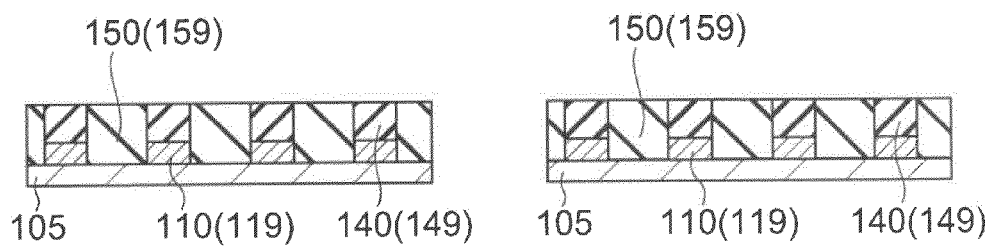

Next, as shown in FIG. 23B, as a film (device isolation insulating film 159) constituting part of the device isolation insulating portion 150 between the memory portion 200 and the like, for instance, a $SiO_2$ film is formed by the CVD process or coating process to fill the space between the patterned portions of the first conductive film 119 and the switching element film 149, and planarized by CMP.

Figure 23C:
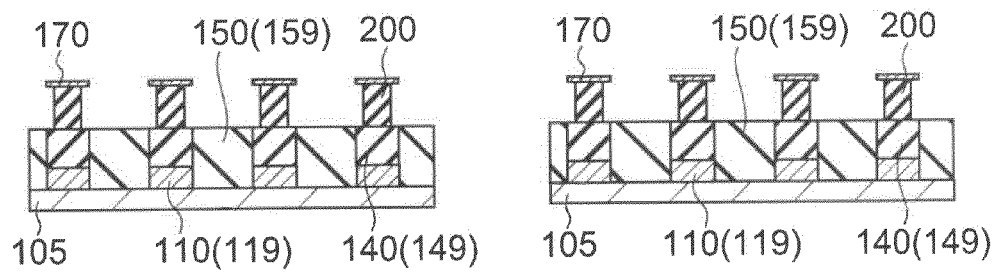

Next, as shown in FIG. 23C, a film (memory portion film 209) for the memory portion 200 and a film (cap film 179) constituting the cap layer 170 are formed. Subsequently, the sidewall of the memory portion 200 is etched back by photolithography and dry etching.

Figure 23D:
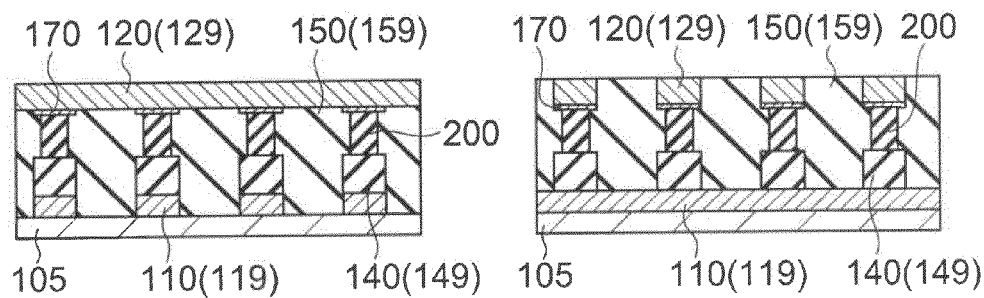

Next, as shown in FIG. 23D, for instance, a $SiO_2$ film is formed by the CVD process or coating process as a film (device isolation insulating film 159) constituting another part of the device isolation insulating portion 150 to fill the space between the memory portion 200 and the like. The surface is planarized by the CMP process as necessary. Subsequently, a film (second conductive film 129) constituting the second electrode 120 is formed. Then, for instance, by photolithography and dry etching, the second conductive film 129 is patterned. Subsequently, a film constituting another part of the device isolation insulating portion 150 is formed between the patterned portions of the second electrode 120, and planarized as necessary.

Also in this method, the area of the memory portion 200 can be made smaller than the area of the cross surface 130.

Furthermore, the method of providing a recess in the insulating layer and providing a memory portion 200 inside the recess described with reference to FIGS. 9 to 17C can be combined with the method of selectively etching the sidewall of the memory portion described with reference to FIGS. 18 to 23D.

In the foregoing, the first electrode 110 and the second electrode 120 can illustratively be made of tungsten. The memory portion 200 can illustratively be made of $Mn_2O_3$. The insulating portion 160 and the device isolation insulating portion 150 can illustratively be made of $SiO_2$. The switching element portion 140 can illustratively be a PIN diode made of polysilicon. However, the invention is not limited thereto. The first electrode 110 and the second electrode 120 can be made of various conductive materials. The memory portion 200 can be made of various materials exhibiting resistance change and various materials exhibiting phase change-induced resistance change. The insulating portion 160 and the device isolation insulating portion 150 can be made of various insulating materials. The switching element portion 140 can be made of various materials and structures exhibiting nonlinear electrical characteristics.

As described above, the first electrode 110 and the second electrode 120 can be made of e.g. tungsten, tungsten silicide, or tungsten nitride. The memory portion 200 can be made of various transition metal oxides having electrical resistance changing with the applied voltage or current, such as nickel oxide ($NiO_x$), titanium oxide ($TiO_x$), $ZnMn_2O_4$, and $Pr_xCa_{1-x}MnO_3$. Alternatively, the memory portion 200 can be made of a phase transition material.

In the nonvolatile memory device and the method for manufacturing the same of the embodiments, the switching element portion 140 may include a transistor, besides a diode and a MIM element.

The embodiments of the invention have been described above with reference to examples. However, the invention is not limited to these examples. For instance, any specific configurations of the components constituting the nonvolatile memory device and the method for manufacturing the same are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible. Such combinations are also encompassed within the scope of the invention as long as they fall within the spirit of the invention.

Furthermore, those skilled in the art can suitably modify and implement the nonvolatile memory device and the method for manufacturing the same described above in the embodiments of the invention. All the nonvolatile memory devices and the methods for manufacturing the same thus modified are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A nonvolatile memory device comprising:
a substrate;
a first electrode provided on the substrate;
a second electrode crossing on the first electrode; and a memory portion provided between the first electrode and the second electrode and including a resistance change material and an insulator in contact with the resistance change material within the memory portion;
said resistance change material and said insulator only extending laterally over a cross surface of the first electrode and the second electrode opposed to each other by the crossing,
both of an area of a first memory portion surface of the memory portion in contact with the first electrode and an area of a second memory portion surface of the memory portion in contact with the second electrode being smaller than an area of a cross surface of the first electrode and the second electrode opposed to each other by the crossing, and
the memory portion has a tapered pillar shape extending along a stacking direction from the first electrode toward the second electrode.

2. The device according to claim 1, wherein the resistance change material has an electrical resistance changing with applied voltage.

3. The device according to claim 1, further comprising:
a switching element portion provided between the first electrode and the memory portion or between the second electrode and the memory portion.

4. A nonvolatile memory device comprising:
a substrate;
a first electrode provided on the substrate;
a second electrode crossing on the first electrode; and a memory portion provided between the first electrode and the second electrode and including a resistance change material and an insulator in contact with the resistance change material within the memory portion;
said resistance change material and said insulator only extending laterally over a cross surface of the first electrode and the second electrode opposed to each other by the crossing,
at least one of an area of a first memory portion surface of the memory portion opposed to the first electrode and an area of a second memory portion surface of the memory portion opposed to the second electrode being smaller than an area of said cross surface of the first electrode and the second electrode opposed to each other by the crossing, and
the memory portion extending along a stacking direction from the first electrode toward the second electrode.

5. The device of claim 4, wherein the resistance change material comprises an annular portion around the insulator.

* * * * *